(12) United States Patent
Choi et al.

(10) Patent No.: US 11,723,244 B2
(45) Date of Patent: Aug. 8, 2023

(54) DISPLAY DEVICE AND METHOD OF MANUFACTURING THE SAME

(71) Applicant: Samsung Display Co., Ltd., Yongin-si (KR)

(72) Inventors: Hyelim Choi, Yongin-si (KR); Joonseok Park, Yongin-si (KR); Myounghwa Kim, Yongin-si (KR); Taesang Kim, Yongin-si (KR); Yeonkeon Moon, Yongin-si (KR); Geunchul Park, Yongin-si (KR); Sangwoo Sohn, Yongin-si (KR); Junhyung Lim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 188 days.

(21) Appl. No.: 17/152,249

(22) Filed: Jan. 19, 2021

(65) Prior Publication Data

US 2021/0391406 A1 Dec. 16, 2021

(30) Foreign Application Priority Data

Jun. 10, 2020 (KR) .................. 10-2020-0070461

(51) Int. Cl.
*H10K 59/131* (2023.01)
*H10K 59/122* (2023.01)
*H10K 59/12* (2023.01)

(52) U.S. Cl.
CPC ......... *H10K 59/131* (2023.02); *H10K 59/122* (2023.02); *H10K 59/1201* (2023.02)

(58) Field of Classification Search
CPC ............ H01L 27/3276; H01L 27/3246; G09G 3/3258; G09G 3/3233; G09G 3/3291;
(Continued)

(56) References Cited

U.S. PATENT DOCUMENTS 7,414,362 B2 * 8/2008 Chung ................ H01L 27/3276
313/506
8,106,402 B2 1/2012 Yeo et al.
(Continued)

FOREIGN PATENT DOCUMENTS

KR 10-1074788 B1 10/2011
KR 10-1108175 B1 1/2012
(Continued)

OTHER PUBLICATIONS

Chen, Rongsheng et al.; "Self-aligned top-gate InGaZnO thin film transistors using $SiO_2/Al_2O_3$ stack gate dielectric"; Thin Solid Films; 2013; pp. 572-575.

*Primary Examiner* — Sardis F Azongha
(74) *Attorney, Agent, or Firm* — Lewis Roca Rothgerber Christie LLP

(57) ABSTRACT

A display device includes: a substrate including a first region and a second region; a first active layer located on the first region and including a first channel region, a first source region at one side of the first channel region, a first drain region at the other side of the first channel region, and a first extension region extending in a direction from the first source region to the second region; a first gate electrode located above the first active layer and overlapping the first channel region; a driving voltage line located on the first active layer, overlapping the first source region, and extending along the first extension region; a first connection electrode located on the first drain region; and a pixel electrode located above the first gate electrode and connected to the first connection electrode.

11 Claims, 17 Drawing Sheets

(58) Field of Classification Search
CPC .. G09G 3/3266; H10K 59/131; H10K 59/122; H10K 59/123; H10K 59/124
See application file for complete search history.

(56) References Cited

U.S. PATENT DOCUMENTS

| | | | |
|---|---|---|---|
| 8,558,239 B2 | 10/2013 | Lee et al. | |
| 8,674,359 B2 | 3/2014 | Noh et al. | |
| 9,397,122 B2* | 7/2016 | Lim | H01L 27/3272 |
| 10,084,031 B2* | 9/2018 | Park | H01L 27/3258 |
| 10,263,211 B2* | 4/2019 | Byun | H01L 27/3272 |
| 10,504,982 B2* | 12/2019 | Lee | H01L 27/3262 |
| 2017/0062542 A1* | 3/2017 | Jung | H01L 51/5203 |
| 2021/0183898 A1* | 6/2021 | Jeong | H01L 29/78624 |

FOREIGN PATENT DOCUMENTS

| | | |
|---|---|---|
| KR | 10-1117725 B1 | 3/2012 |
| KR | 10-2018-0010655 A | 1/2018 |

\* cited by examiner

DISPLAY DEVICE AND METHOD OF MANUFACTURING THE SAME

CROSS-REFERENCE TO RELATED APPLICATION

This application claims priority to, and the benefit of, Korean Patent Application No. 10-2020-0070461, filed on Jun. 10, 2020, in the Korean Intellectual Property Office, the disclosure of which is incorporated by reference herein in its entirety.

BACKGROUND

1. Field

Some embodiments of the present disclosure relate to a display device in which process efficiency may be enhanced and in which a design space may be secured, and a method of manufacturing the same.

2. Description of Related Art

Among display devices, organic light-emitting display devices have wide viewing angles, excellent contrast, and fast response speeds. Thus, they have come into the spotlight as next-generation display devices.

Generally, in organic light-emitting display devices, a thin-film transistor and organic light-emitting devices are formed on a substrate, and the organic light-emitting devices operate by emitting light autonomously. These organic light-emitting display devices are used as display units for small products, such as mobile phones or display units for large products, such as televisions (TVs).

Such display devices include a thin-film transistor (TFT) for driving, and a capacitor. Here, a TFT may include an active layer including a channel region, a source region, and a drain region, and a gate electrode electrically insulated from the active layer by a gate insulating layer.

SUMMARY

However, in a display device and in a method of manufacturing the same according to the related art, a plurality of mask processes may be required, so that process efficiency is reduced, and as a plurality of configurations are provided, a design space may become insufficient.

Some embodiments of the present disclosure include a display device in which process efficiency may be enhanced and in which a design space may be secured, and a method of manufacturing the same. However, this is merely an example, and the scope of the disclosure is not limited thereby.

Additional aspects will be set forth in part in the description that follows and, in part, will be apparent from the description, or may be learned by practice of the presented embodiments of the disclosure.

According to one or more embodiments, a display device includes a substrate including a first region in which a first pixel circuit is located, and a second region in which a second pixel circuit is located, a first active layer located on the first region, and including a first channel region, a first source region at a first side of the first channel region, a first drain region at a second side of the first channel region, and a first extension region extending in a direction from the first source region to the second region, a first gate electrode located above the first active layer, and overlapping the first channel region, a driving voltage line located on the first active layer, overlapping the first source region, and extending along the first extension region, a first connection electrode located on the first drain region, and a pixel electrode located above the first gate electrode and connected to the first connection electrode.

The display device may further include a second active layer located on the first region, and including a second channel region, a second source region at a first side of the second channel region, a second drain region at a second side of the second channel region, and a second extension region extending in a direction from the second source region to the first region, a second gate electrode located above the second active layer, and overlapping the second channel region, a data line located on the second active layer, overlapping the second source region, and extending along the second extension region, a second connection electrode located on the second drain region, and a bridge electrode electrically connecting the second connection electrode to the first gate electrode.

The display device may further include a third active layer located on the second region, and including a third channel region, a third source region at a first side of the third channel region, a third drain region at a second side of the third channel region, and a third extension region extending in a direction from the third source region to the first region, and being integral with the first extension region, and a third gate electrode located above the third active layer and overlapping the third channel region, wherein the driving voltage line extends from the first extension region to the third extension region and overlaps the third source region.

The display device may further include a fourth active layer located on the second region, and including a fourth channel region, a fourth source region at a first side of the fourth channel region, a fourth drain region at a second side of the fourth channel region, and a fourth extension region extending in a direction from the fourth source region to the first region, and being integral with the second extension region, and a fourth gate electrode located above the fourth active layer and overlapping the fourth channel region, wherein the data line extends from the second extension region to the fourth extension region and overlaps the fourth source region.

The display device may further include a gate insulating layer between the first active layer and the first gate electrode in a region overlapping the first gate electrode, and between the second active layer and the second gate electrode in a region overlapping the second gate electrode.

The bridge electrode may include the same material as the pixel electrode, and has a layered structure that is the same as a layered structure of the pixel electrode.

The driving voltage line, the data line, the first connection electrode, and the second connection electrode may include the same material, and have the same layered structure.

The first active layer and the second active layer may include an oxide semiconductor.

The display device may further include a bottom metal layer (BML) having an isolated shape, and located below the first active layer.

The BML may be electrically connected to the pixel electrode through a contact hole.

The display device may further include an opposite electrode located on the pixel electrode, and an intermediate layer between the pixel electrode and the opposite electrode and including an emission layer.

According to one or more embodiments, a method of manufacturing a display device includes a first mask process of forming a first conductive layer on a substrate including a first region and a second region, and patterning the first conductive layer into a bottom metal layer (BML) having an isolated shape, a second mask process of sequentially forming a semiconductor layer and a second conductive layer on a result of the first mask process, patterning the semiconductor layer into a first active layer and a second active layer in the first region, and patterning the second conductive layer into a driving voltage line, a data line, a first connection electrode, and a second connection electrode, a third mask process of sequentially forming a first insulating layer and a third conductive layer on a result of the second mask process, patterning the first insulating layer into a gate insulating layer in the first region, and patterning the third conductive layer into a first gate electrode and a second gate electrode, and a fourth mask process of forming a second insulating layer on a result of the third mask process, and forming a plurality of contact holes in the second insulating layer, wherein the first active layer in the first region includes a first channel region, a first source region at a first side of the first channel region, a first drain region at a second side of the first channel region, and a first extension region extending in a direction from the first source region to the second region, and wherein the second active layer in the first region includes a second channel region, a second source region at a first side of the second channel region, a second drain region at a second side of the second channel region, and a second extension region extending in a direction from the second source region to the first region.

The second mask process may include patterning the semiconductor layer into a third active layer and a fourth active layer in the second region, and patterning the second conductive layer into a driving voltage line, a data line, a third connection electrode, and a fourth connection electrode, wherein the third mask process includes patterning the third conductive layer into a third gate electrode and a fourth gate electrode in the second region, wherein the third active layer in the second region includes a third channel region, a third source region at a first side of the third channel region, a third drain region at a second side of the third channel region, and a third extension region extending in a direction from the third source region to the first region and being integral with the first extension region, wherein the fourth active layer in the second region includes a fourth channel region, a fourth source region at a first side of the fourth channel region, a fourth drain region at a second side of the fourth channel region, and a fourth extension region extending in a direction from the fourth source region to the first region and being integral with the second extension region, wherein the driving voltage line extends from the first extension region to the third extension region and overlaps the third source, and wherein the data line extends from the second extension region to the fourth extension region and overlaps the fourth source region.

A second mask in the second mask process may include a half-tone mask including a fully transmissive region, a semi-transmissive region, and a non-transmissive region.

The second mask process may include forming a first photosensitive layer on the first conductive layer and patterning the first photosensitive layer by using the second mask to form a first photosensitive layer pattern, wherein, the second mask is located above the second conductive layer and, in the first photosensitive layer pattern, a first photosensitive layer is not located in a non-coating region overlapping the fully transmissive region of the second mask, the first photosensitive layer is located in a semi-coating region overlapping the semi-transmissive region of the second mask and has a smaller thickness than an initial thickness, and the first photosensitive layer is located in the fully coating region overlapping the non-transmissive region of the second mask and has an initial thickness.

The second mask process may include removing a semiconductor layer and a first conductive layer located in the non-coating region, ashing an entire surface of the first photosensitive layer pattern to a thickness of a first photosensitive layer located in the semi-coating region, and removing the first conductive layer located in the semi-coating region by using selective etching.

The method may further include a fifth mask process of forming a fourth conductive layer on a result of the fourth mask process and patterning the fourth conductive layer into a pixel electrode and a bridge electrode, wherein the bridge electrode electrically connects the second connection electrode to the first gate electrode.

The fourth mask process may include forming a first contact hole for exposing a portion of the first gate electrode, forming a second contact hole for exposing a portion of the first connection electrode, and forming a third contact hole for exposing a portion of the second connection electrode in the second insulating layer.

The fourth mask process may further include forming a fourth contact hole for exposing a portion of the BML in the second insulating layer, wherein the BML is connected to the pixel electrode through the fourth contact hole.

The method may further include a sixth mask process of forming a pixel-defining layer on a result of the fifth mask process, and patterning the pixel-defining layer into an emission region and a non-emission region.

Aspects other than those described above will be apparent from a detailed description of the disclosure for implementing the following disclosure, the claims, and the drawings.

These general and specific aspects can be implemented by using a system, method, computer program, or any combination of systems, methods, and computer programs.

BRIEF DESCRIPTION OF THE DRAWINGS

The above and other aspects of some of the embodiments of the disclosure will be more apparent from the following description taken in conjunction with the accompanying drawings, in which.

DETAILED DESCRIPTION

Figure 1:
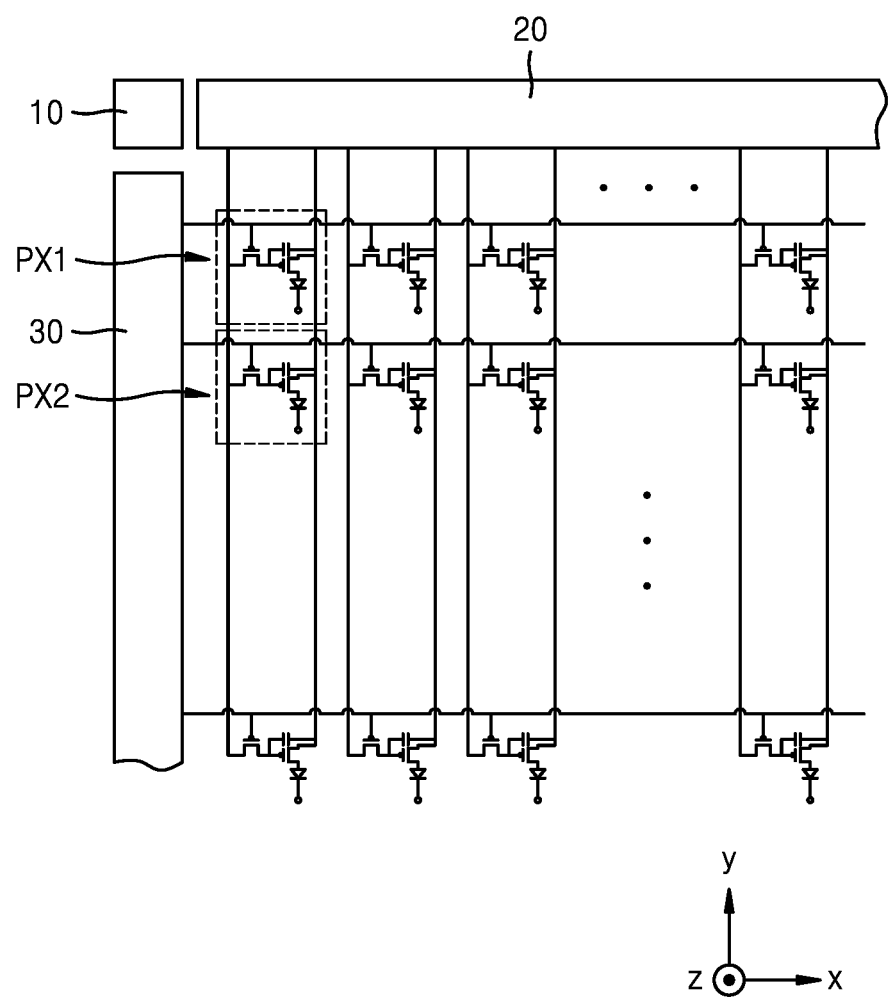
FIG. 1 is a configuration diagram schematically illustrating a portion of a display device according to some embodiments.

Features of the inventive concept and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a configuration diagram schematically illustrating a portion of a display device according to some embodiments.

The display device according to some embodiments may have a display area in which light is emitted, and a non-display area in which no light is emitted. This will be understood that a substrate 100 includes the display area and the non-display area.

Hereinafter, an organic light-emitting display device will be described as an example of the display device according to some embodiments. However, a display device according to the disclosure is not limited thereto. In other embodiments, examples of the display device according to the present disclosure may include a display device, such as an inorganic light-emitting display device, or such as a quantum dot light-emitting display device. For example, an emission layer of a display element included in the display device may include an organic material, an inorganic material, a quantum dot, an organic material and a quantum dot, or an inorganic material and a quantum dot.

As shown in FIG. 1, the display device according to some embodiments may include a controller 10, a data driver 20, and a scan driver 30.

The data driver 20 may provide a data signal to pixels, and the scan driver 30 may provide a scan signal to the pixels. In the display area, the pixels may be located at points in which data lines DL connected to the data driver 20 and extending in an y-axis direction, and scan lines SL connected to the scan driver 30 and extending in a x-axis direction, cross one another. Also, a pixel circuit may be located in each of the pixels.

In this case, the "pixels" may refer to sub-pixels that emit different colors. Each of the pixels may include a display element, and may emit, for example, red, green, blue, or white light. Each pixel may include the pixel circuit connected to the scan line SL and the data line DL, and an organic light-emitting diode OLED that is a display element connected to the pixel circuit.

Hereinafter, a region of a first pixel of the pixels in which a first pixel circuit and a light-emitting diode, which is connected to the first pixel circuit, are located, may be referred to as a "first region PX1." A region of a second pixel that is adjacent to the first pixel, in which a second pixel circuit and a light-emitting diode, which is connected to the second pixel circuit, are located, may be referred to as a "second region PX2." The first region PX1 and the second region PX2 are illustrated in FIG. 1.

Figure 2:
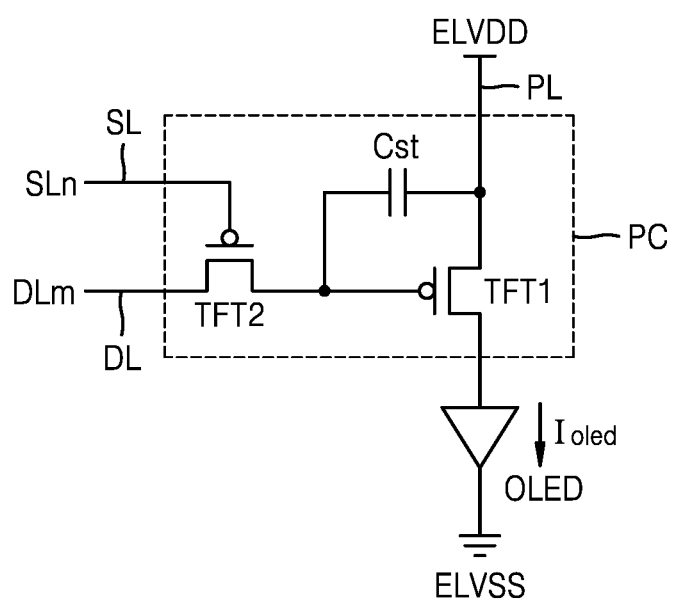
FIG. 2 is an equivalent circuit diagram schematically illustrating pixel circuits included in the display device of FIG. 1.

FIG. 2 is an equivalent circuit diagram schematically illustrating pixel circuits included in the display device of FIG. 1.

A pixel circuit PC may include a plurality of thin-film transistors and a capacitor. In some embodiments, the pixel circuit PC may include a first thin-film transistor TFT1, a second thin-film transistor TFT2, and a capacitor Cst, as shown in FIG. 2. In this case, the first thin-film transistor TFT1 may be a driving thin-film transistor (TFT), and the second thin-film transistor TFT2 may be a switching TFT. The second thin-film transistor TFT2 may be connected to a scan line SL and to a data line DL, and may be configured to transmit a data signal DLm input through the data line DL to the first thin-film transistor TFT1 according to a scan signal SLn input through the scan line SL.

The capacitor Cst may be electrically connected to the second thin-film transistor TFT2 and a driving voltage line PL, and may store a voltage that corresponds to a difference between a first voltage ELVDD that is applied to the driving voltage line PL and a second voltage that is applied to the second thin-film transistor TFT2.

The first thin-film transistor TFT1 may be connected to the driving voltage line PL and the capacitor Cst, and may control a driving current, which flows from the driving voltage line PL to an organic light-emitting diode OLED, in response to a value of the voltage stored in the capacitor Cst. An opposite electrode, for example, a cathode, of the organic light-emitting diode OLED may be connected to a common voltage ELVSS. The organic light-emitting diode OLED may display an image by emitting light having brightness that corresponds to the driving current.

In addition, FIG. 2 illustrates P-type thin-film transistors TFT1 and TFT2, but other embodiments are not limited thereto. For example, a portion or all of a plurality of thin-film transistors of the pixel circuit PC may be N-type or P-type thin-film transistors. That is, the plurality of thin-film transistors may include a channel region in which impurities are not doped, and a source region and a drain region, which are at both sides of the channel region and in which impurities are doped. The impurities may vary according to the type of a thin-film transistor and may include N-type or P-type impurities.

Also, FIG. 2 illustrates the case where the pixel circuit PC includes two thin-film transistors TFT1 and TFT2 and one capacitor Cst, although other embodiments are not limited thereto. The number of thin-film transistors and the number of capacitors may be variously changed according to the design of the pixel circuit PC. For example, the pixel circuit PC may include three or more thin-film transistors and/or two or more capacitors. In an example, the pixel circuit PC may include seven thin-film transistors and one capacitor. However, for convenience of explanation, the case where the pixel circuit PC includes two thin-film transistors and one capacitor will be described below.

Figure 3:
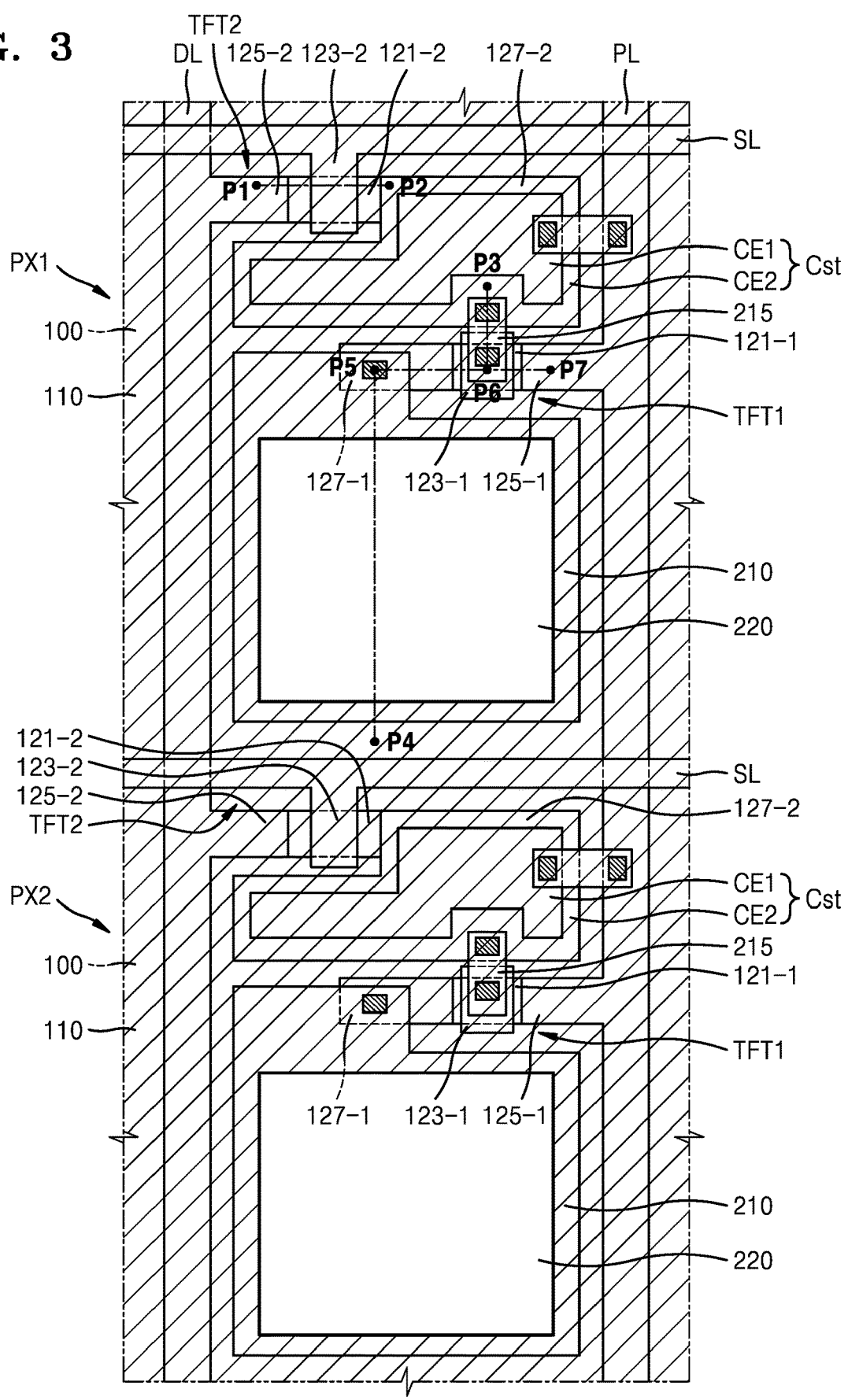
FIG. 3 is a layout diagram schematically illustrating locations of thin-film transistors and a capacitor arranged in the pixel circuits of the display device of FIG. 1.
Figure 4:
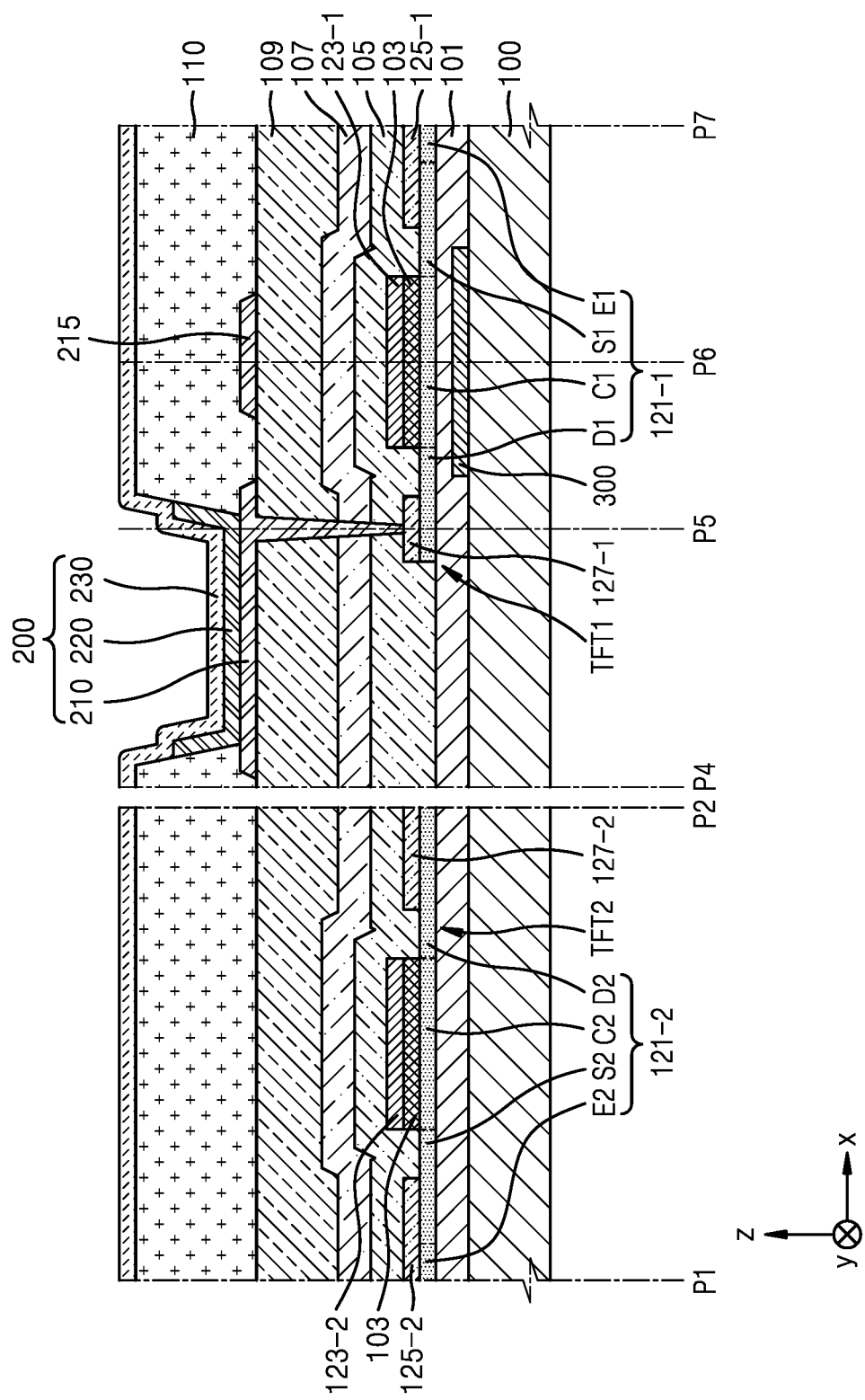
FIG. 4 is a cross-sectional view of the display device taken along the lines P1 and P2 and lines P4 to P7 of FIG. 3.
Figure 5:
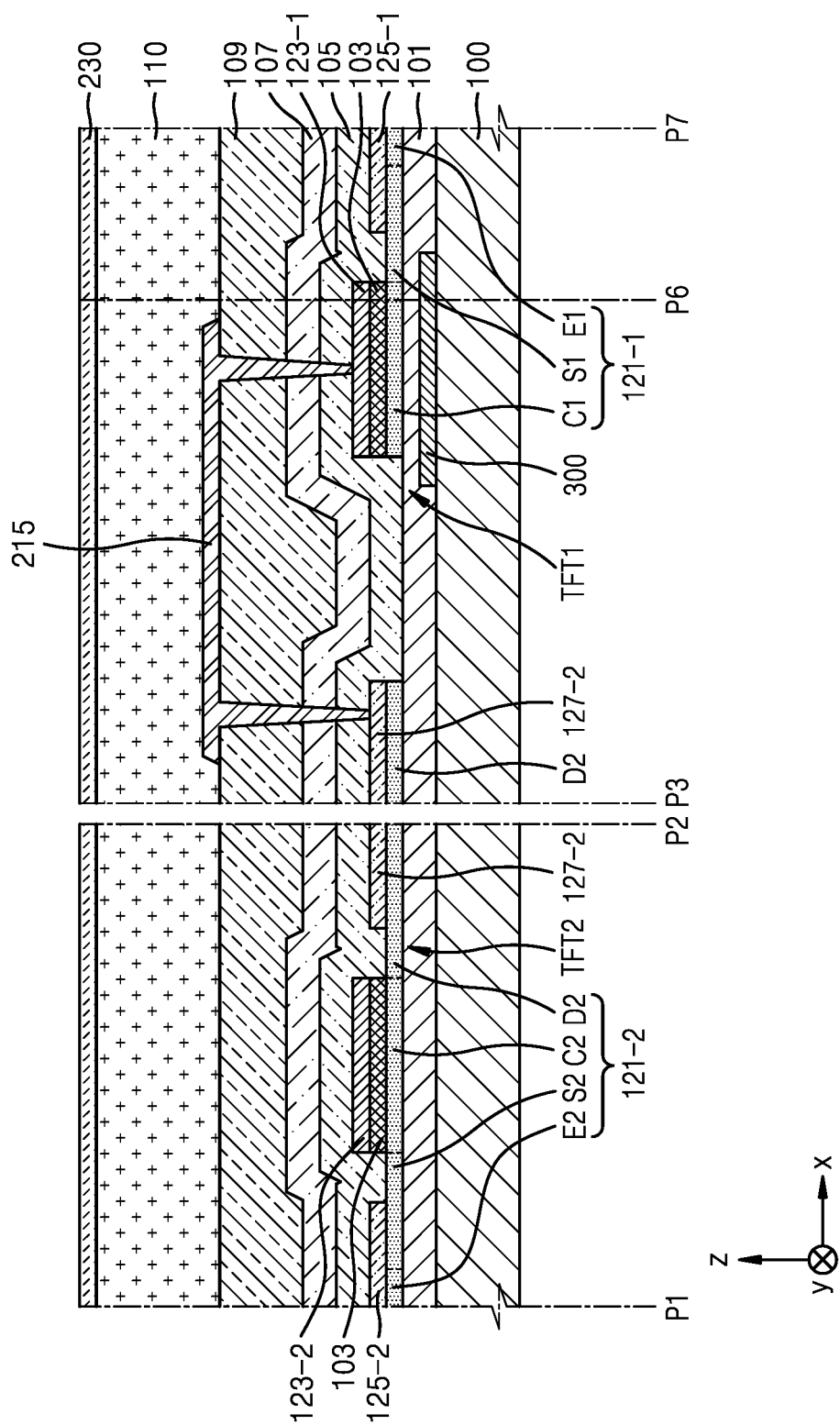
FIG. 5 is a cross-sectional view of the display device taken along the lines P1 to P2, and lines P3 to P7 of FIG. 3.

FIG. 3 is a layout diagram schematically illustrating locations of thin-film transistors TFT1 and TFT2 and the capacitor Cst arranged in the pixel circuit PC of the display device of FIG. 1, FIG. 4 is a cross-sectional view of the display device taken along the lines P1 and P2 and lines P4 to P7 of FIG. 3, and FIG. 5 is a cross-sectional view of the display device taken along the lines P1 to P2, and lines P3 to P7 of FIG. 3.

For convenience, a bottom metal layer (BML) 300 is omitted from FIG. 3. That is, although not shown in FIG. 3, the BML 300 and a connection configuration with the BML 300 may overlap other configurations. Also, it will be understood that a hatched portion of FIG. 3 represents a region covered by a pixel-defining layer 110, and an unhatched portion of FIG. 3 represents a region in which a pixel electrode 210 is exposed through an opening of the pixel-defining layer 110.

As shown in FIG. 3, the display device according to some embodiments may include a substrate 100 including a plurality of regions, and the thin-film transistors TFT1 and TFT2, the capacitor Cst, the driving voltage line PL, the data line DL, a display element 200, the pixel-defining layer 110, etc., having a multi-layer structure may be located on the substrate 100.

The substrate 100 may include a glass material, a metal material, a ceramic material, or a flexible or bendable material. When the substrate 100 is flexible or bendable, the substrate 100 may include polymer resin, such as polyethersulphone (PES), polyacrylate, polyetherimide polyethylene naphthalate (PEN), polyethylene terephthalate (PET), polyphenylene sulfide (PPS), polyarylate, polyimide (PI), polycarbonate (PC), or cellulose acetate propionate (CAP). The substrate 100 may have a single-layer structure or a multi-layer structure including the materials described above. When the substrate 100 has a multi-layer structure, there may be various modifications in which the substrate 100 includes two layers, which may include polymer resin and a barrier layer including an inorganic material, such as silicon oxide, silicon nitride, or silicon oxynitride between the two layers.

Referring to FIGS. 4 and 5, a buffer layer 101 may be located on the substrate 100. The buffer layer 101 may include an inorganic material such as silicon oxide, silicon nitride, and/or silicon oxynitride, and may have a single-layer structure or a multi-layer structure. Also, the buffer layer 101 may extend to both the display area and the non-display area. The buffer layer 101 may be configured to increase or improve smoothness of a top surface of the substrate 100, or to reduce, minimize, or prevent penetration of impurities or moisture from an exterior of the substrate 100 into an active layer.

On the other hand, in some embodiments, the BML 300 that is a lower metal layer may be located on the substrate 100. The BML 300 having an isolated shape may be located below a first active layer 121-1 of the first thin-film transistor TFT1. In this case, the buffer layer 101 may be located on the substrate 100 while covering the BML 300. The BML 300 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W) and/or copper (Cu). The bottom metal layer BML may have a single-layer structure or a multi-layer structure including the aforementioned materials.

Figure 6:
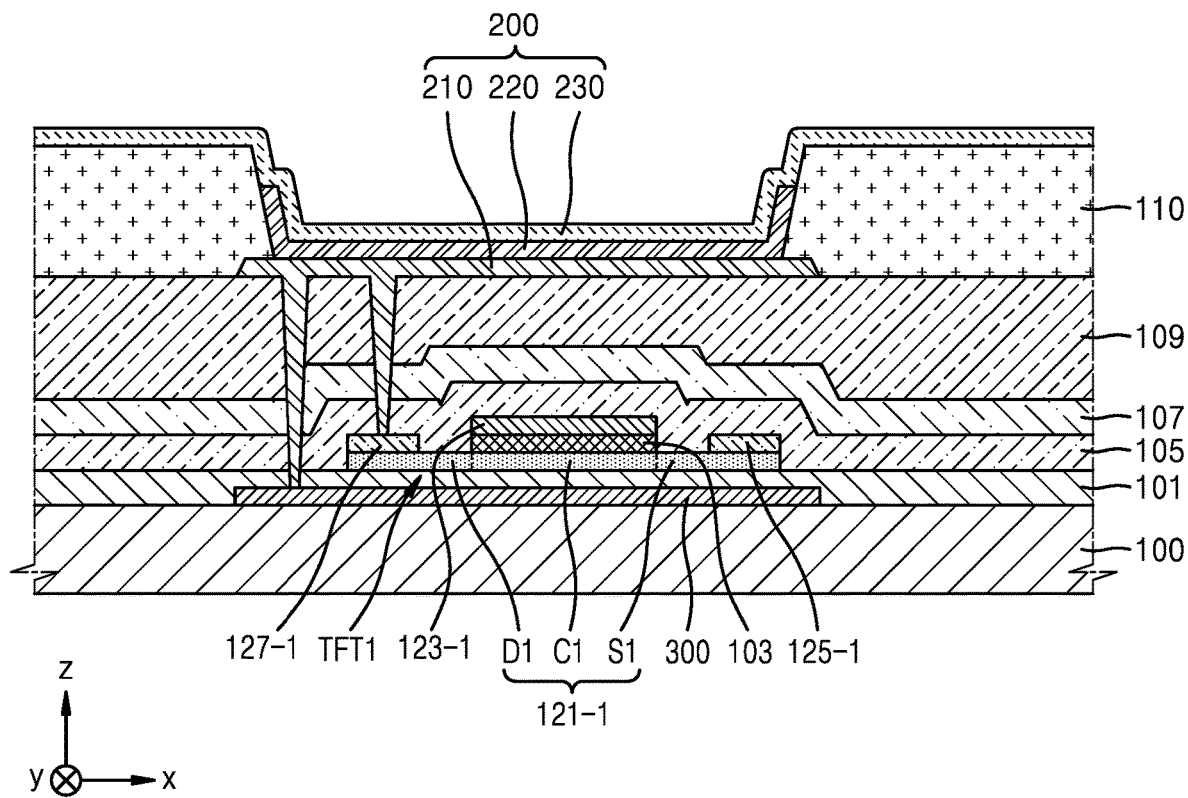
FIG. 6 is a cross-sectional view schematically illustrating a connection structure of a bottom metal layer (BML) included in the display device of FIG. 1.

Also, the BML 300 may be connected to the pixel electrode 210 through a contact hole for exposing a portion of the BML 300 from a bottom surface of the pixel electrode 210, and a detailed description thereof will be provided with reference to FIG. 6.

The pixel circuit PC may be located on the buffer layer 101 in the display area on the substrate 100. The pixel circuit PC may include the first thin-film transistor TFT1, the second thin-film transistor TFT2, the capacitor Cst, the driving voltage line PL, and the data line DL. The display element electrically connected to the pixel circuit PC will be understood such that the pixel electrode 210 included in the display element 200 is electrically connected to the first thin-film transistor TFT1.

The display device according to some embodiments may include the first thin-film transistor TFT1 that is the driving TFT, and the second thin-film transistor TFT2 that is the switching TFT, which are in the first region PX1.

The first thin-film transistor TFT1 may include a first active layer 121-1 and a first gate electrode 123-1. In this case, the first active layer 121-1 may include a first channel region C1, a first source region S1 at one side of the first channel region C1, a first drain region D1 at the other side of the first channel region C1, and a first extension region E1 extending in a direction from the first source region S1 to the second region PX2. The first gate electrode 123-1 may be located above the first active layer 121-1 and may overlap the first channel region C1. Also, the first gate electrode 123-1 may be connected to the pixel electrode 210 of the display element 200.

On the other hand, one end 125-1 of the driving voltage line PL may be located on the first active layer 121-1, may overlap the first source region S1, and may extend along the first extension region E1 of the first active layer 121-1. The first connection electrode 127-1 may be located on the first active layer 121-1 and may overlap the first drain region D1. That is, one end 125-1 of the driving voltage line PL may be located at a source electrode of the first thin-film transistor TFT1, and the first connection electrode 127-1 may be located at a drain electrode of the first thin-film transistor TFT1.

The second thin-film transistor TFT2 may include a second active layer 121-2 and a second gate electrode 123-2. In this case, the second active layer 121-2 may include a second channel region C2, a second source region S2 at one side of the second channel region C2, a second drain region D2 at the other side of the second channel region C2, and the firsts extension region E1 extending in a direction from the second source region S2 to the second region PX2. The second gate electrode 123-2 may be located above the second active layer 121-2 and may overlap the second channel region C2. One end 125-2 of the data line DL may be located on the second active layer 121-2, may overlap the second source region S2 and may extend along a second extension region E2 of the second active layer 121-2. The second connection electrode 127-2 may be located on the second drain region D2 of the second active layer 121-2. That is, one end 125-2 of the data line DL may be located on a source electrode of the second thin-film transistor TFT2, and the second connection electrode 127-2 may be located on the drain electrode of the second thin-film transistor TFT2.

The first thin-film transistor TFT1 and the second thin-film transistor TFT2 may be electrically connected to each other. To this end, the display device may further include a bridge electrode 215 for electrically connecting the second connection electrode 127-2 of the second thin-film transistor TFT2 and the first gate electrode 123-1 of the first thin-film transistor TFT1. In this case, the bridge electrode 215 may include the same material as that of the pixel electrode 210 and may have a layered structure that is the same as that of the pixel electrode 210. That is, the bridge electrode 215 may be formed in one process step by using the same material as that of the pixel electrode 210 when the pixel electrode 210 is formed.

Also, the display device according to some embodiments may further include a third thin-film transistor TFT3 that is a driving TFT and has the same structure as the first thin-film transistor TFT1, and a fourth thin-film transistor TFT4 that is a switching TFT and has the same structure as the second thin-film transistor TFT2, which are located in the second region PX2.

The third thin-film transistor TFT3 may include a third active layer, a third gate electrode, a third connection electrode, and one end of the driving voltage line PL. The third active layer may include a third channel region, a third source region at one side of the third channel region, a third drain region at the other side of the third channel region, and a third extension region extending in a direction from the third source region to the first region PX1, the third extension region being integral with the first extension region E1. That is, the first active layer 121-1 of the first thin-film transistor TFT1 in the first region PX1 and the third active layer of the third thin-film transistor TFT3 in the second region PX2 may extend from an end of the first active layer 121-1 to an end of the third active layer and may be formed integrally with each other.

Also, the driving voltage line PL may extend from the first extension region E1 of the first active layer 121-1 of the first thin-film transistor TFT1 in the first region PX1 to the third extension region of the third active layer of the third thin-film transistor TFT3 in the second region PX2. The driving voltage line PL may overlap the third source region. That is, the driving voltage line PL may extend from an end in the first region PX1 to an end in the second region PX2, and may be formed integrally.

The fourth thin-film transistor TFT4 may include a fourth active layer, a fourth gate electrode, a fourth connection electrode, and one end of the data line DL. The fourth active layer may include a fourth channel region, a fourth source region at one side of the fourth channel region, a fourth drain region at the other side of the fourth channel region, and a fourth extension region extending in a direction from the fourth source region to the first region PX1 and being integral with the second extension region E2. That is, the second active layer 121-2 of the second thin-film transistor TFT2 in the first region PX1 and a fourth active layer of the fourth thin-film transistor TFT4 in the second region PX2 may extend from an end of the second active layer 121-2 to an end of the fourth active layer.

Also, the data line DL may extend from the second extension region E2 of the second active layer 121-2 of the second thin-film transistor TFT2 in the first region PX1 to the fourth extension region of the fourth active layer of the fourth thin-film transistor TFT4 in the second region PX2. The data line DL may overlap the fourth source region. That is, the data line DL may extend from an end in the first region PX1 to an end in the second region PX2 and may be formed integrally.

As described above, in the display device according to some embodiments, the active layers of the driving TFT in each of the first region PX1 and the second region PX2 may be integrally formed, and the active layers of the switching TFT in each of the first region PX1 and the second region PX2 may be integrally formed, and the driving voltage line PL and the data line DL on the active layers may be integrally formed with each other in the first region PX1 and the second region PX2. Thus, the active layer and the driving voltage line PL or the active layer and the data line DL may be formed by applying only one mask process. Thus, the efficiency of a process may be enhanced. However, an electrode in the source region and an electrode in the drain region may be separated from each other by patterning only a conductive layer on the active layer, and by exposing a portion of the active layer. To this end, a selective etching process may be used, and a detailed description thereof will be provided later.

Also, the first active layer 121-1 and the second active layer 121-2 may include an oxide semiconductor such as indium-gallium zinc oxide (IGZO). However, other embodiments are not limited thereto, and the first active layer 121-1 and the second active layer 121-2 may include amorphous silicon, polycrystalline silicon, or an organic semiconductor material.

The gate electrodes 123-1 and 123-2 may include various conductive materials including Mo, Al, Cu, Ti, and the like, and may have various layered structures. For example, the gate electrodes may include a Mo layer and an Al layer or may have a multi-layer structure of Mo/Al/Mo.

In an example, the driving voltage line PL, the data line DL, and the connection electrodes 127-1 and 127-2 may be located on the same layer. That is, the driving voltage line PL, the data line DL, and the connection electrodes 127-1 and 127-2 may include the same material, may have the same layered structure, and may be formed concurrently or substantially simultaneously in one process. As shown in FIGS. 3 through 6, one end 125-1 of the driving voltage line PL may be located in the first source region S1 that is a position of the source electrode of the first thin-film transistor TFT1, one end 125-2 of the data line DL may be located in the second source region S2 that is a position of the source electrode of the second thin-film transistor TFT2, the first connection electrode 127-1 may be located in the first drain region D1 that is a position of the drain electrode of the first thin-film transistor TFT1, and the second connection electrode 127-2 may be located in the second drain region D2 that is a position of the drain electrode of the second thin-film transistor TFT2. Thus, one end 125-1 of the driving voltage line PL and one end 125-2 of the data line DL do not occupy separate areas on a plan view, and may overlap the first thin-film transistor TFT1 or the second thin-film transistor TFT2 so that a wider design space may be secured.

Thus, the driving voltage line PL, the data line DL, and the connection electrodes 127-1 and 127-2 may include various conductive materials including Mo, Al, Cu, Ti, and the like, and may have various layered structures. For example, the driving voltage line PL, the data line DL, and the connection electrodes 127-1 and 127-2 may include a Ti layer and an Al layer, or may have a multi-layer structure of Ti/Al/Ti.

Also, to secure an insulation property between the active layers 121-1 and 121-2 and the gate electrodes 123-1 and 123-2, a gate insulating layer 103 including an inorganic material, such as silicon oxide, silicon nitride and/or silicon oxynitride, may be between the active layers 121-1 and 121-2 and the gate electrodes 123-1 and 123-2, respectively. Furthermore, a first interlayer insulating layer 105 that is a layer having a certain dielectric constant may be located above the gate electrodes 123-1 and 123-2. The first interlayer insulating layer 105 may be an insulating layer including silicon oxide, silicon nitride and/or silicon oxynitride. The driving voltage line PL, the data line DL, and the connection electrodes 127-1 and 127-2 may be located on the first interlayer insulating layer 105. In this way, the insulating layer including the inorganic material may be formed through chemical vapor deposition (CVD) or atomic layer deposition (ALD). This may be applied to embodiments that will be described later, and to modified examples thereof.

In some embodiments, the gate insulating layer 103 may be respectively between the active layers 121-1 and 121-2 and the gate electrodes 123-1 and 123-2 in a region in which the gate insulating layer 103 overlaps the gate electrodes 123-1 and 123-2. That is, the gate insulating layer 103 may be located only in the same region as a region in which the gate electrodes 123-1 and 123-2 are located, and may be etched in one or more regions that are other than the region in which the gate electrodes 123-1 and 123-2 are located. Thus, the gate insulating layer 103 and the gate electrodes 123-1 and 123-2 may be etched once, and may be formed by using only one mask process. Thus, the efficiency of a process may be enhanced.

The capacitor Cst may have an upper electrode CE1 and a lower electrode CE2. The upper electrode CE1 and the lower electrode CE2 may overlap each other in a state in which an interlayer insulating layer is therebetween to enable capacitance. In this case, the interlayer insulating layer may serve as a dielectric layer of the capacitor Cst.

In some embodiments, the upper electrode CE1 of the capacitor Cst may be located on the same layer as the gate electrodes 123-1 and 123-2 of the first and second thin-film transistors TFT1 and TFT2. That is, the upper electrode CE1 may include the same material as that of the gate electrodes 123-1 and 123-2, and may have a layered structure that is the same as that of the gate electrodes 123-1 and 123-2. In this case, as with the gate electrodes 123-1 and 123-2, the gate insulating layer 103 may be located below the upper electrode CE1 and may overlap the upper electrode CE1 with substantially the same area as the upper electrode CE1, and the gate insulating layer 103 may serve as a dielectric layer.

Also, the lower electrode CE2 of the capacitor Cst may be located on the same layer as the connection electrodes 127-1 and 127-2 of the first and second thin-film transistors TFT1 and TFT2. That is, the lower electrode CE2 may include the same material as that of the connection electrodes 127-1 and 127-2, and may have a layered structure that is the same as that of the connection electrodes 127-1 and 127-2. In this case, the lower electrode CE2 of the capacitor Cst may be formed integrally with a connection electrode in one drain region of the first and second thin-film transistors TFT1 and TFT2.

Also, the lower electrode CE2 of the capacitor Cst may be located on the same layer as the connection electrodes 127-1 and 127-2, the driving voltage line PL, and the data line DL. That is, when the lower electrode CE2 of the capacitor Cst, the connection electrodes 127-1 and 127-2, the driving voltage line PL, and the data line DL are located on the same layer, they may include the same material and may have the same layered structure. In this case, the first active layer 121-1 or the second active layer 121-2 may be located below the lower electrode CE2, and may overlap the lower electrode CE2 with substantially the same area as the lower electrode CE2.

A planarization layer 109 may be located on the first and second thin-film transistors TFT1 and TFT2. When an organic light-emitting device, as an example of a display element, is located above the first and second thin-film transistors TFT1 and TFT2, the planarization layer 109 may generally planarize upper portions of protective layers for covering the first and second thin-film transistors TFT1 and TFT2. The planarization layer 109 may include an organic material, such as benzocyclobutene (BCB) or hexamethyldisiloxane (HMDSO). In FIGS. 3 through 5, the planarization layer 109 has a single layer structure, but may have a multi-layer structure in other embodiments, and various modifications are possible.

In the display area of the substrate 100, the display element 200 may be located on the planarization layer 109. The display element 200 may be an organic light-emitting device including the pixel electrode 210, an opposite electrode 230, and an intermediate layer 220 between the pixel electrode 210 and the opposite electrode 230 and including an emission layer.

The pixel electrode 210 may be in contact with the first connection electrode 127-1 of the first thin-film transistor TFT1 through an opening formed in the planarization layer 109 to thereby be electrically connected to the first thin-film transistor TFT1, as shown in FIGS. 3 and 5. The pixel electrode 210 may be a (semi-) transparent electrode or reflective electrode. In some embodiments, the pixel electrode 210 may include a reflective layer including Ag, Mg, Al, Pt, Pd, Au, Ni, Nd, Ir, Cr, and a compound thereof, and a transparent or semi-transparent electrode layer formed on the reflective layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the pixel electrode 210 may have a stack structure of ITO/Ag/ITO.

The pixel-defining layer 110 may be located on the planarization layer 109. The pixel-defining layer 110 may have an opening that corresponds to each of sub-pixels, thereby defining an emission area and a non-emission area. In this case, the opening may be formed in such a way that at least a portion of the center of the pixel electrode 210 may be exposed. Also, the pixel-defining layer 110 may increase a distance between edges of the pixel electrode 210 and the opposite electrode 230 on the pixel electrode 210, thereby preventing an arc from occurring in the edges of the pixel electrode 210. The pixel-defining layer 110 may include an organic material, such as polyimide or HMDSO.

The intermediate layer 220 of the display element 200 may include a small molecular weight or polymer material.

When the intermediate layer 220 includes a small molecular weight material, the intermediate layer 220 may have a structure in which a hole injection layer (HIL), a hole transport layer (HTL), an emission layer (EML), an electron transport layer (ETL) and an electron injection layer (EIL) are stacked in a single or composite structure, and may include various organic materials, such as copper phthalocyanine (CuPc), N,N'-Di(naphthalene-1-yl)-N,N'-diphenyl-benzidine (NPB), and tris-8-hydroxyquinoline aluminum) (Alq3). These layers may be formed through a method, such as vacuum deposition.

When the intermediate layer 220 includes a polymer material, the intermediate layer 220 may have a structure including the HTL and the EML. In this case, the HTL may include poly(3,4-ethylenedioxythiophene)(PEDOT), and the EML may include poly-phenylenevinylene-based and polyfluorene-based polymer material. The intermediate layer 220 may be formed through a method, such as screen printing or inkjet printing, or laser induced thermal imaging (LITI). The intermediate layer 220 is not limited to the above-described example but may have various structures. Also, the intermediate layer 220 may include a layer integrally formed in the plurality of pixel electrodes 210, or may include a layer patterned to correspond to each of the plurality of pixel electrodes 210 (to overlap each of the plurality of pixel electrodes 210 when viewed from a direction perpendicular to the substrate 100).

The opposite electrode 230 of the display element 200 may be located at an upper portion of the display area. In an example, the opposite electrode 230 may include an integral layer to cover the entire surface of the display area, and may be located at the upper portion of the display area. That is, the opposite electrode 230 may be integrally formed in the plurality of display elements 200 to correspond to the plurality of pixel electrodes 210. In this case, the opposite electrode 230 may cover the display area, and may extend to a portion of the non-display area outside the display area. In another example, the opposite electrode 230 may include a layer patterned to correspond to each of the plurality of pixel electrodes 210 (e.g., to overlap each of the pixel electrodes 210 when viewed from a direction perpendicular to the substrate 100), and may be located at the upper portion of the display area.

The opposite electrode 230 may be a transparent electrode or reflective electrode. In some embodiments, the opposite electrode 230 may be a transparent or semi-transparent electrode, and may include a metal thin layer having a small work function including lithium (Li), calcium (Ca), LiF/Ca, LiF/Al, Ag, Mg, and a compound thereof. Also, the opposite electrode 230 may further include a transparent conductive oxide (TCO) layer, such as ITO, IZO, ZnO or $In_2O_3$, in addition to the metal thin layer.

Also, in other embodiments, the display device may further include an encapsulation layer that is located to cover the display element 200, and may thereby protect the display element 200. The encapsulation layer may reduce or prevent the likelihood of damage to the display element 200 due to moisture or oxygen from the outside. The encapsulation layer may cover the display area, and may extend to at least a portion of the non-display area. The encapsulation layer may include a first inorganic encapsulation layer, an organic encapsulation layer, and a second inorganic encapsulation layer.

FIG. 6 is a cross-sectional view schematically illustrating a connection structure of a BML included in the display device of FIG. 1.

As shown in FIG. 6, the BML 300 may be spaced from a lower portion of the first active layer 121-1 of the first thin-film transistor TFT1. The BML 300 may be connected to the pixel electrode 210 through a contact hole for exposing a portion of the BML 300 from a bottom surface of the pixel electrode 210. Thus, a constant voltage or signal may be applied to the BML 300 so that damage of the pixel circuit PC due to electrostatic discharge may be reduced or prevented, and the reliability of the first thin-film transistor TFT1 may be thereby enhanced.

Figure 7:
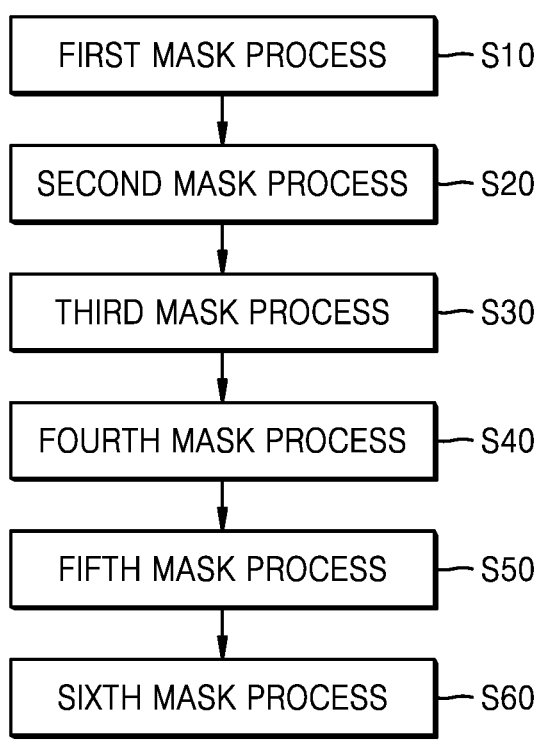
FIG. 7 is a flowchart schematically illustrating a method of manufacturing the display device of FIG. 1.

FIG. 7 is a flowchart schematically illustrating a method of manufacturing the display device of FIG. 1.

As shown in FIG. 7, the method of manufacturing the display device, according to some embodiments may include first through sixth mask processes S10, S20, S30, S40, S50, and S60. That is, processes of sequentially applying six masks may be performed to manufacture the display device.

Hereinafter, each of the mask processes will be described in detail with reference to FIGS. 8 through 17, and a redundant content with the above-described content will be omitted.

For example, the first mask process S10 will be described with reference to FIG. 8, the second mask process S20 will be described with reference to FIGS. 9 through 12, the third mask process S30 will be described with reference to FIG. 13, the fourth mask process S40 will be described with reference to FIG. 14, the fifth mask process S50 will be described with reference to FIG. 15, the sixth mask process S60 will be described with reference to FIG. 16, and an operation of forming the intermediate layer 220 and the opposite electrode 230 of the display element 200 will be described with reference to FIG. 17.

FIGS. 8 through 17 are cross-sectional views of the display device taken along the first region PX1. However, the method of manufacturing the display device according to some embodiments may be performed concurrently or substantially simultaneously in a plurality of regions, for example, in regions PX1 and PX2. For example, a material layer may be formed on the entire surface of the substrate 100 including the plurality of regions, and the formed material layer may be simultaneously patterned in each of the regions.

On the other hand, in some embodiments, first through sixth masks used in the first through sixth mask processes S10, S20, S30, S40, S50, and S60 may mean a mask assembly including a frame having one or more openings (opened regions), and a mask in which one or more openings are formed along a pattern. Also, a half-tone mask may be applied if suitable (for example, in the second mask process S20).

Figure 8:
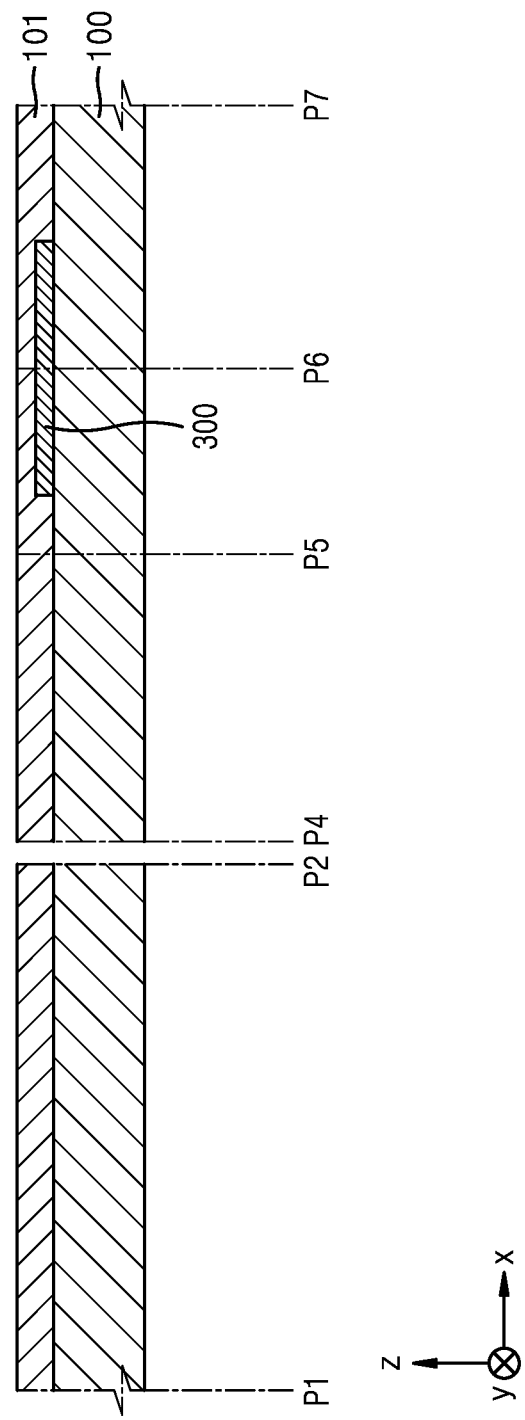
FIGS. 8 through 17 are cross-sectional views schematically illustrating part of the method of manufacturing the display device of FIG. 1.

FIG. 8 is a process diagram illustrating the result of the first mask process S10.

The first mask process S10 may include forming a first conductive layer on the substrate 100, and patterning the first conductive layer on the substrate 100 into the BML 300 having an isolated shape. A region in which the BML 300 is patterned may be a region in which a driving thin-film transistor is located in subsequent processes. Also, as shown in FIG. 8, the BML 300 may be patterned on the substrate 100, and the buffer layer 101 may be formed on the formed BML 300.

FIGS. 9 through 12 are process diagrams illustrating the second mask process S20.

The second mask process S20 may include sequentially forming a first semiconductor layer 121m and a second conductive layer 125m on the result of the first mask process, patterning the first semiconductor layer 121m into the first active layer 121-1 and the second active layer 121-2, and patterning the second conductive layer 125m into the driving voltage line PL, the data line DL, the first connection electrode 127-1, and the second connection electrode 127-2.

In some embodiments, the second mask used in the second mask process S20 may be a half-tone mask capable of forming a photosensitive layer having a step difference for each region. The half-tone mask may include a fully transmissive region, a semi-transmissive region, and a non-transmissive region. The fully transmissive region may be a region in which all of light irradiated onto the mask is transmitted, the semi-transmissive region may be a region in which only a portion of light irradiated onto the mask is transmitted, and the non-transmissive region may be a region in which all of light irradiated onto the mask is blocked. When the photosensitive layer formed on the entire surface of the substrate 100 to a uniform thickness is patterned using the half-tone mask, in a case where the half-tone mask is arranged on an upper portion of the photosensitive layer to overlap the photosensitive layer, an area overlapping the fully transmissive region of the half-tone mask may be a non-coating area A3 in which all of the photosensitive layer is removed, an area overlapping the semi-transmissive region of the half-tone mask may be a semi-coating area A2 in which only a portion of the photosensitive layer is removed, and an area overlapping the non-transmissive region of the half-tone mask may be a fully coating area A1 in which the photosensitive layer is not removed.

For example, the half-tone mask may be formed in a certain pattern on a transparent substrate such as a quartz substrate. In this case, the non-transmissive region may be patterned using a material such as Cr or $CrO_2$ on the quartz substrate, and a semi-transmissive portion may adjust light transmittance of irradiated light by adjusting the ratio or thickness of a composition component by using at least one material selected from the group consisting of Cr, Si, Mo, tantalum (Ta), and Al.

For example, patterning of the first semiconductor layer 121m and the second conductive layer 125m in the second mask process S20 may include forming a first photosensitive layer 400 on the second conductive layer 125m, forming a first photosensitive layer pattern by patterning the first photosensitive layer 400 using the second mask, removing the first semiconductor layer 121m and the second conductive layer 125m, which are located in the non-coating area A3 of the first photosensitive layer pattern, ashing the entire surface of the first photosensitive layer pattern to a thickness of the first photosensitive layer 400 located in the semi-coating area A2 of the first photosensitive layer pattern, removing the second conductive layer 125m located in the semi-coating area A2 of the first photosensitive layer pattern using selective etching, and removing the first photosensitive layer 400 from the entire surface of the first photosensitive layer pattern.

In this case, the first photosensitive layer 400 may include a material (photoresist) that causes a chemical change when light is irradiated onto the first photosensitive layer 400. For example, the first photosensitive layer 400 may include a negative type photoresist, such as Bis-azide, methacrylic acid ester, or cinnamon acid ester, and/or may include a positive type photoresist, such as methyl polymethacrylate, naphthkinone diazide, or polybten-1-sulfone. However, the first photosensitive layer 400 is not limited to the above-described example.

Figure 9:
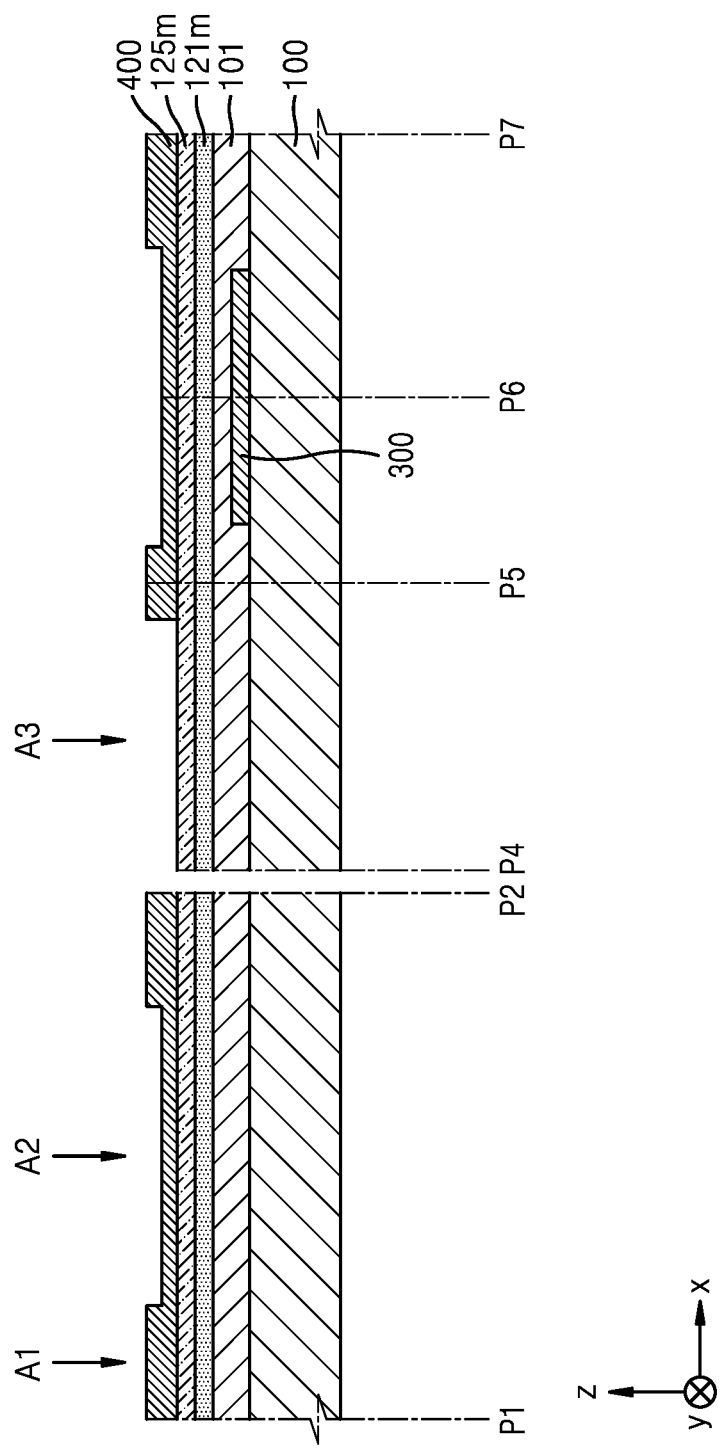

As shown in FIG. 9, in the first photosensitive layer pattern, when the second mask is located on the second conductive layer 125m, all of light irradiated on the fully transmissive region may transmit through the non-coating area A3 overlapping the fully transmissive region of the second mask so that all of the first photosensitive layer 400 may be removed, and thus an opening for exposing the second conductive layer 125m may be formed. Further, a portion of light irradiated on the semi-transmissive region may transmit through the semi-transmissive area A2 overlapping the semi-transmissive region of the second mask so that the first photosensitive layer 400 having a smaller thickness than an initial thickness of the first photosensitive layer 400 may be located. Also, all of light irradiated on the non-transmissive region may be blocked in the fully coating area A1 overlapping the non-transmissive region of the second mask so that the first photosensitive layer 400 may remain, and the first photosensitive layer 400 having the initial thickness may be formed.

Figure 10:
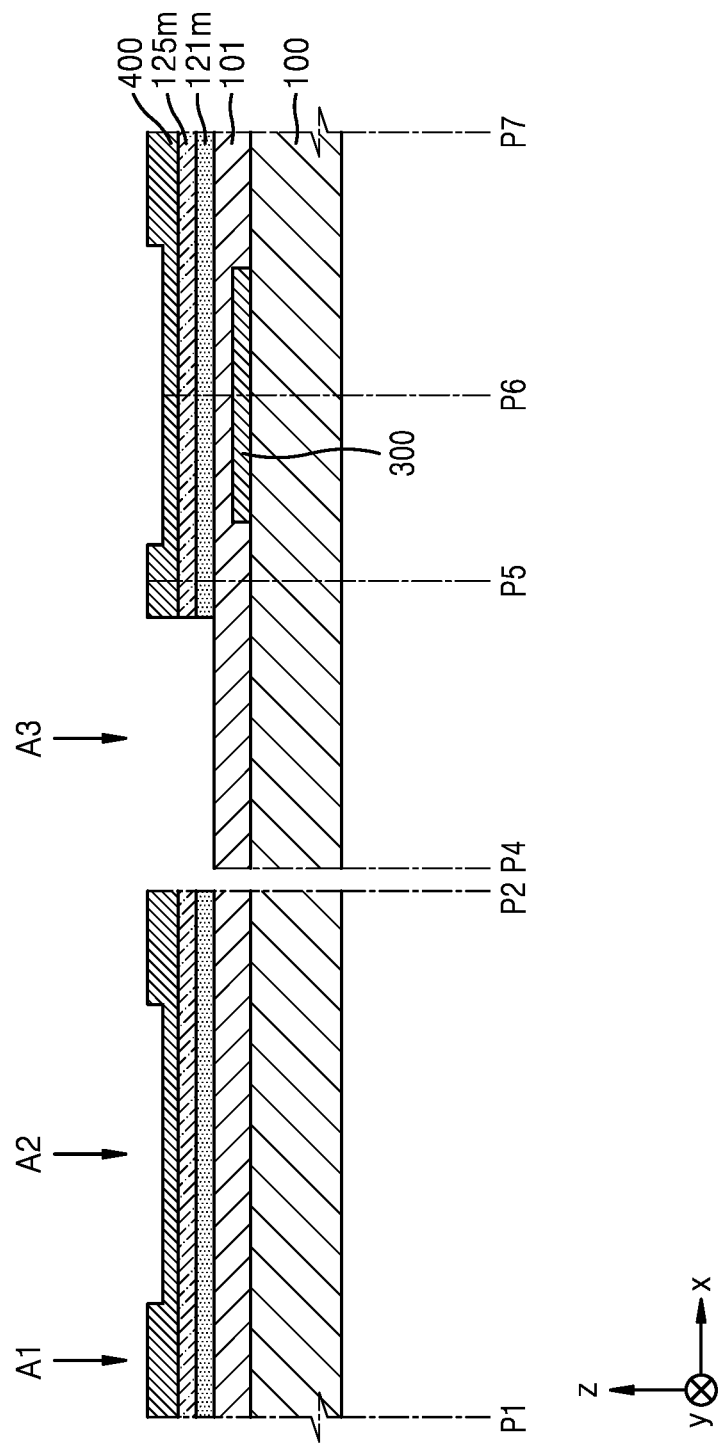

Subsequently, as shown in FIG. 10, portions of the first semiconductor layer 121m and the second conductive layer 125m that are located in the non-coating area A3 of the first photosensitive layer pattern may be removed. A dry etching process using a photoresist, a wet etching process, or the like may be applied to such a removal process. However, an arbitrary patterning process may be used in other embodiments. This may also be applied to other patterning processes of the method of manufacturing the display device.

Figure 11:
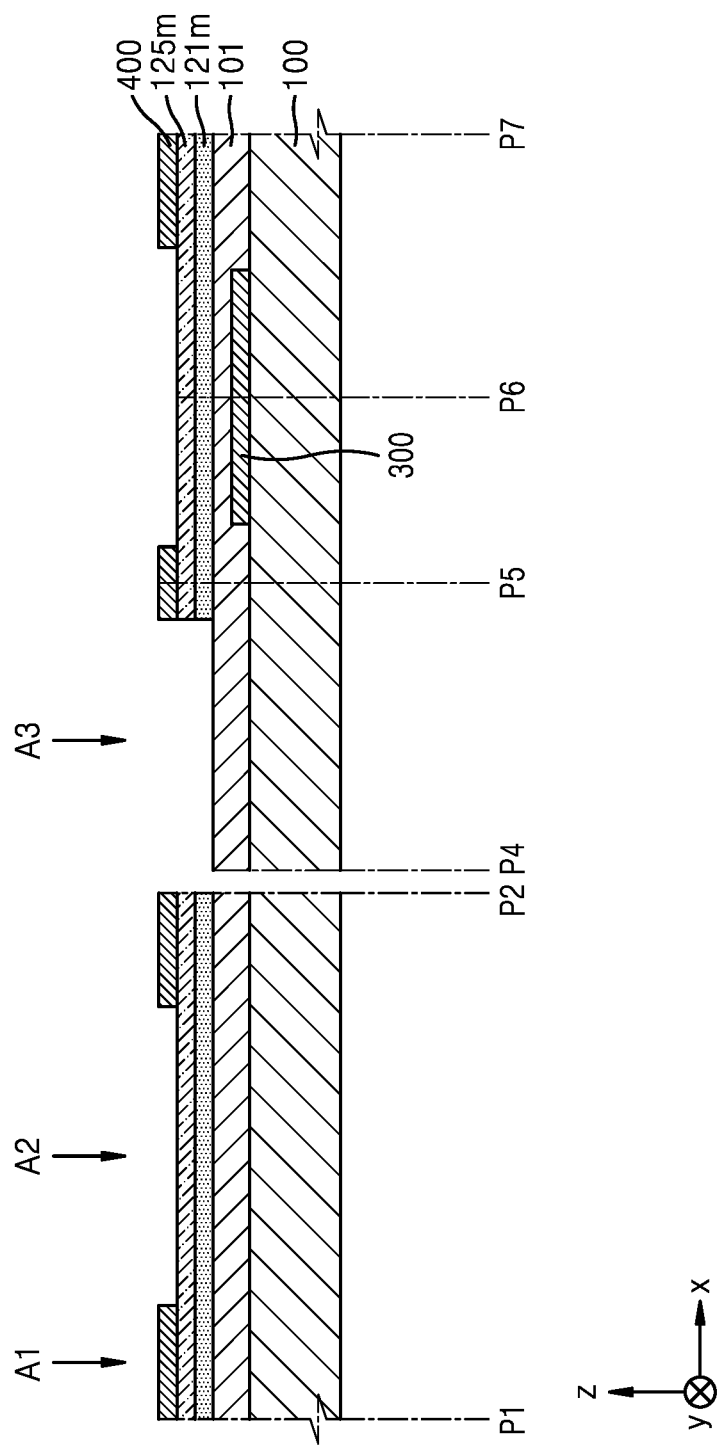

Subsequently, as shown in FIG. 11, the ashing process may be performed to remove a portion of the first photosensitive layer 400 that is located in the semi-coating area A2 of the first photosensitive layer pattern from the entire surface of the first photosensitive layer pattern. Referring to FIG. 11, after the ashing process is performed, a portion of the first photosensitive layer 400 may remain in the fully coating area A1, and all portions of the first photosensitive layer 400 may be removed from the semi-coating area A2. Thus, the second conductive layer 125m located in the semi-coating area A2 may be exposed.

For example, in the ashing process, an oxygen gas may be supplied, and radio frequency or microwave may be applied, to thereby generate plasma, and ions or radical components of the plasma may make a chemical reaction with the photoresist, and these ions may collide with a photosensitive layer (photoresist) so that the photosensitive may be removed. However, other embodiments are not limited thereto.

Figure 12:
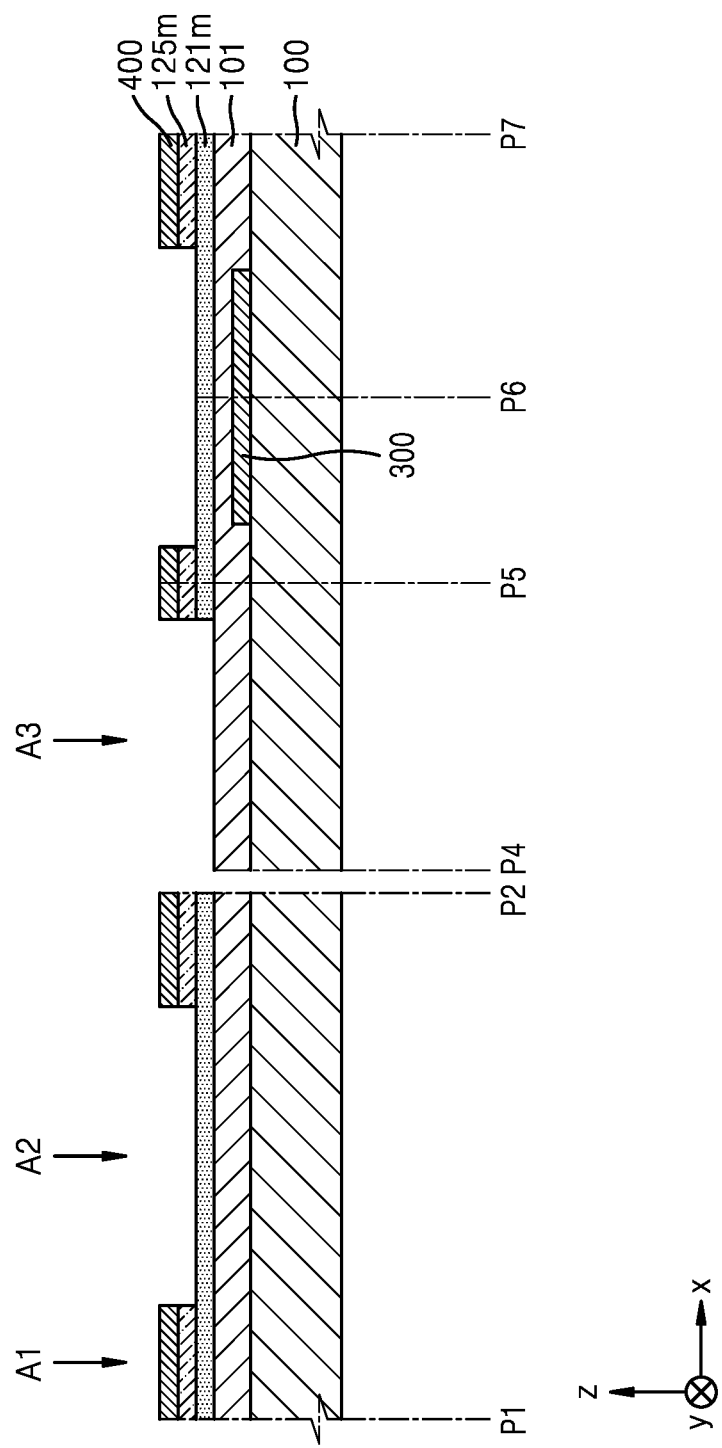

Subsequently, as shown in FIG. 12, the second conductive layer 125m located in the semi-coating area A2 exposed by the ashing process may be removed by using a selective etching process. In this case, the selective etching process may be a dry etching process using a photoresist, a wet etching process, or the like, but the process is not limited thereto. The selective etching process may include an arbitrary etching process for enhancing selectivity of a layer to be etched, like in a process using a material that satisfies a pre-set etching ratio with respect to the second conductive layer 125m and the first semiconductor layer 121m.

When patterning of the active layers 121-1 and 121-2, the driving voltage line PL, the data line DL, and the connection electrodes 127-1 and 127-2 is completed through the above-described procedure, the first photosensitive layer 400 may be removed from the entire surface of the first photosensitive layer pattern. A process of removing the first photosensitive layer 400 may use a lift off process or strip process, but the process is not limited thereto.

Although not shown in FIG. 12, when a lower electrode CE2 of the capacitor Cst is located on the same layer as the driving voltage line PL, the data line DL, and the connection electrodes 127-1 and 127-2, the lower electrode CE2 may be formed therewith in the second mask process S20. As with the driving voltage line PL, the data line DL, and the connection electrodes 127-1 and 127-2, an active layer having substantially the same area as the area of the lower electrode CE2 may be located at a lower portion of the lower electrode CE2.

Figure 13:
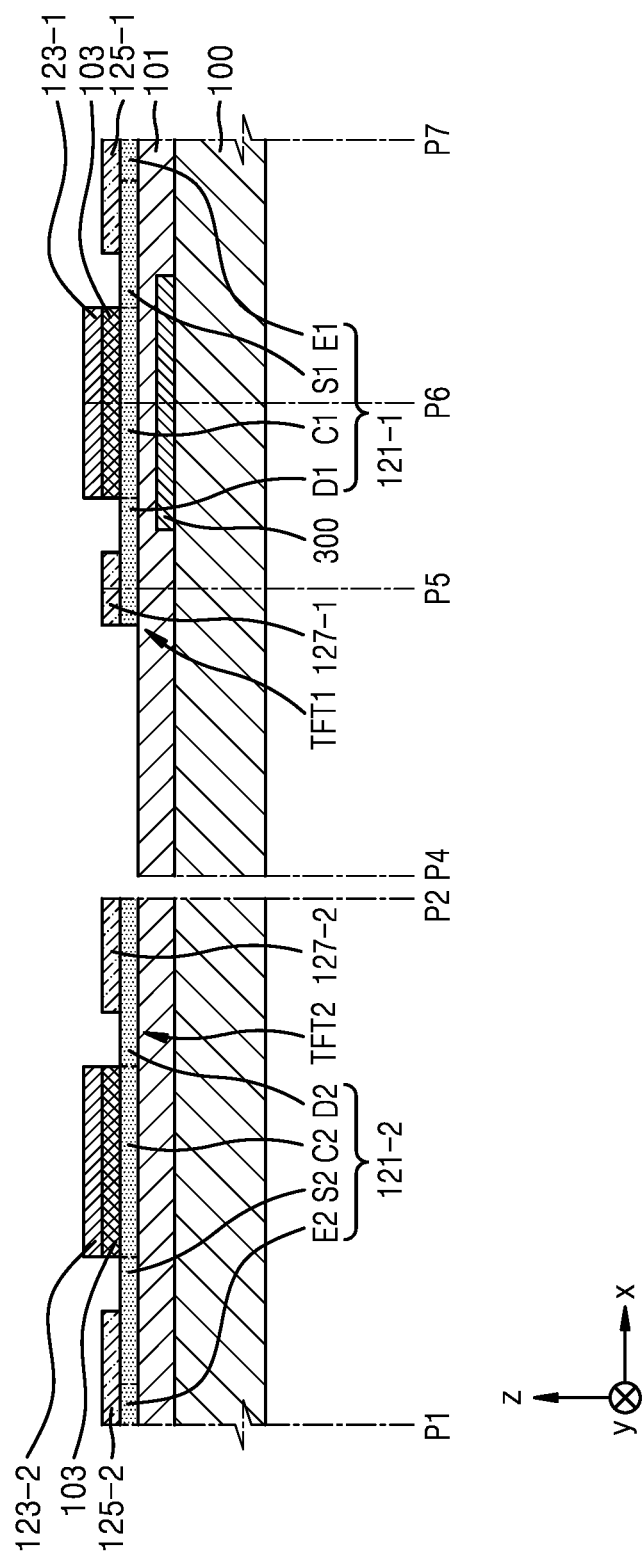

FIG. 13 is a process diagram illustrating the result of the third mask process S30.

The third mask process S30 may include sequentially forming a first insulating layer and a third conductive layer on the result of the second mask process S20, patterning the first insulating layer into a gate insulating layer 103 using the third mask, and patterning the third conductive layer into gate electrodes 123-1 and 123-2.

For example, the third mask process S30 may include sequentially forming the first insulating layer and the third conductive layer on the entire surface of the result of the second mask process S20, forming a second photosensitive layer pattern using the second mask after a second photosensitive layer is formed on the third conductive layer, and removing the first insulating layer and the third conductive layer located in regions that are other than a region in which the gate insulating layer 103 and the gate electrodes 123-1 and 123-2 are located by performing an etching process. In this case, an etching process on the gate insulating layer 103 and the gate electrodes 123-1 and 123-2 might not be separately performed, but instead one etching process may be performed to concurrently or substantially simultaneously etch the gate insulating layer 103 and the gate electrodes 123-1 and 123-2. Thus, portions of the first insulating layer in a region in which the gate electrodes 123-1 and 123-2 are not located may be etched and removed. The gate insulating layer 103 may be located substantially only in a region overlapping the gate electrodes 123-1 and 123-2.

In some embodiments, when an upper electrode CE1 of the capacitor Cst is located on the same layer as the gate electrodes 123-1 and 123-2, the upper electrode CE1 may be formed together therewith in the third mask process S30, and as with the gate electrodes 123-1 and 123-2, the gate insulating layer 103 having substantially the same area as the area of the upper electrode CE1 may be located at a lower portion of the upper electrode CE1.

Figure 14:
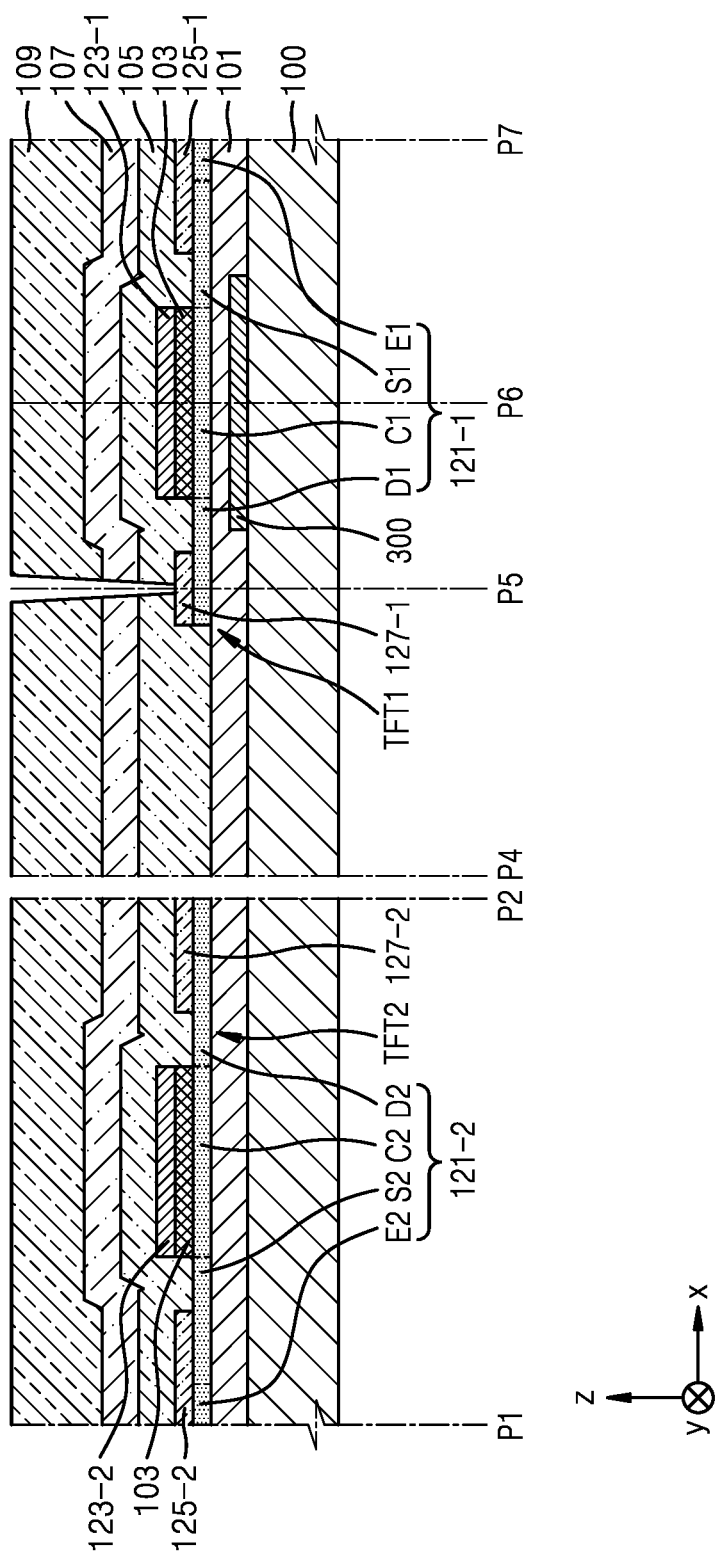

FIG. 14 is a process diagram illustrating the result of the fourth mask process S40.

The fourth mask process S40 may include forming a second insulating layer on the result of the third mask process S30, and forming a plurality of contact holes on the second insulating layer by using the fourth mask.

For example, in the fourth mask process S40, a photosensitive layer pattern may be formed on the result of the third mask process S30 so that the second insulating layer may be exposed only in a position where the plurality of contact holes are to be formed by using the fourth mask, and contact holes may be formed in the second insulating layer in regions in which the second insulating layer is exposed. Also, an additional layer (for example, an insulating layer, a protective layer, a planarization layer, or the like) may be located at an upper or lower portion of the second insulating layer. In this case, the contact holes formed in the second insulating layer may extend to the additional layer.

In this case, the plurality of contact holes may include a first contact hole for exposing part of the first gate electrode 123-1, a second contact hole for exposing part of the first connection electrode 127-1, a third contact hole for exposing part of the second connection electrode 127-2, and a fourth contact hole for exposing part of the BML 300.

Figure 15:
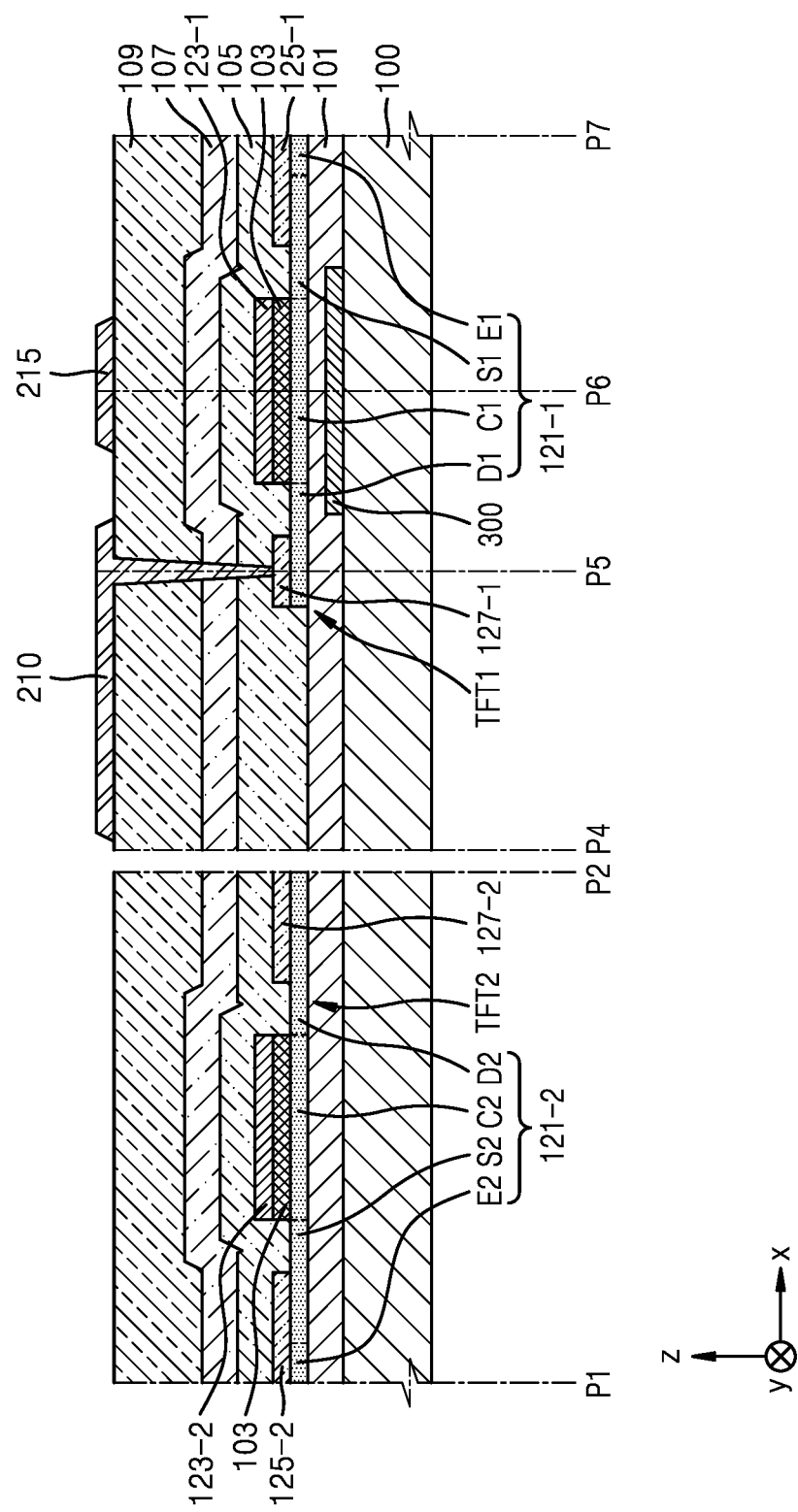

FIG. 15 is a process diagram illustrating the result of the fifth mask process S50.

The fifth mask process S50 may include forming a fourth conductive layer on the result of the fourth mask process S40, and patterning the fourth conductive layer into the pixel electrode 210 and the bridge electrode 215.

For example, in the fifth mask process S50, a photosensitive layer pattern may be formed on the result of the fourth mask process S40 in such a way that the top surface of the result of the fourth mask process S40 may be exposed only in regions in which the pixel electrode 210 and the bridge electrode 215 are to be formed by using the fifth mask, and an electrode material may be arranged in the exposed regions so that the pixel electrode 210 and the bridge electrode 215 may be formed.

The pixel electrode 210 may be connected to the first connection electrode 127-1 through the second contact hole formed in the fourth mask process S40, and the bridge electrode 215 may be connected to the first gate electrode 123-1 and the second connection electrode 127-2 through the first contact hole and the third contact hole formed in the fourth mask process S40. Thus, the first thin-film transistor TFT1 and the pixel electrode 210 may be electrically connected to each other, and the first thin-film transistor TFT1 and the second thin-film transistor TFT2 may be electrically connected to each other through the bridge electrode 215.

In the fifth mask process S50, the electrode material may be arranged even in the fourth contact hole. In this case, the BML 300 may be connected to the pixel electrode 210 through the fourth contact hole.

Figure 16:
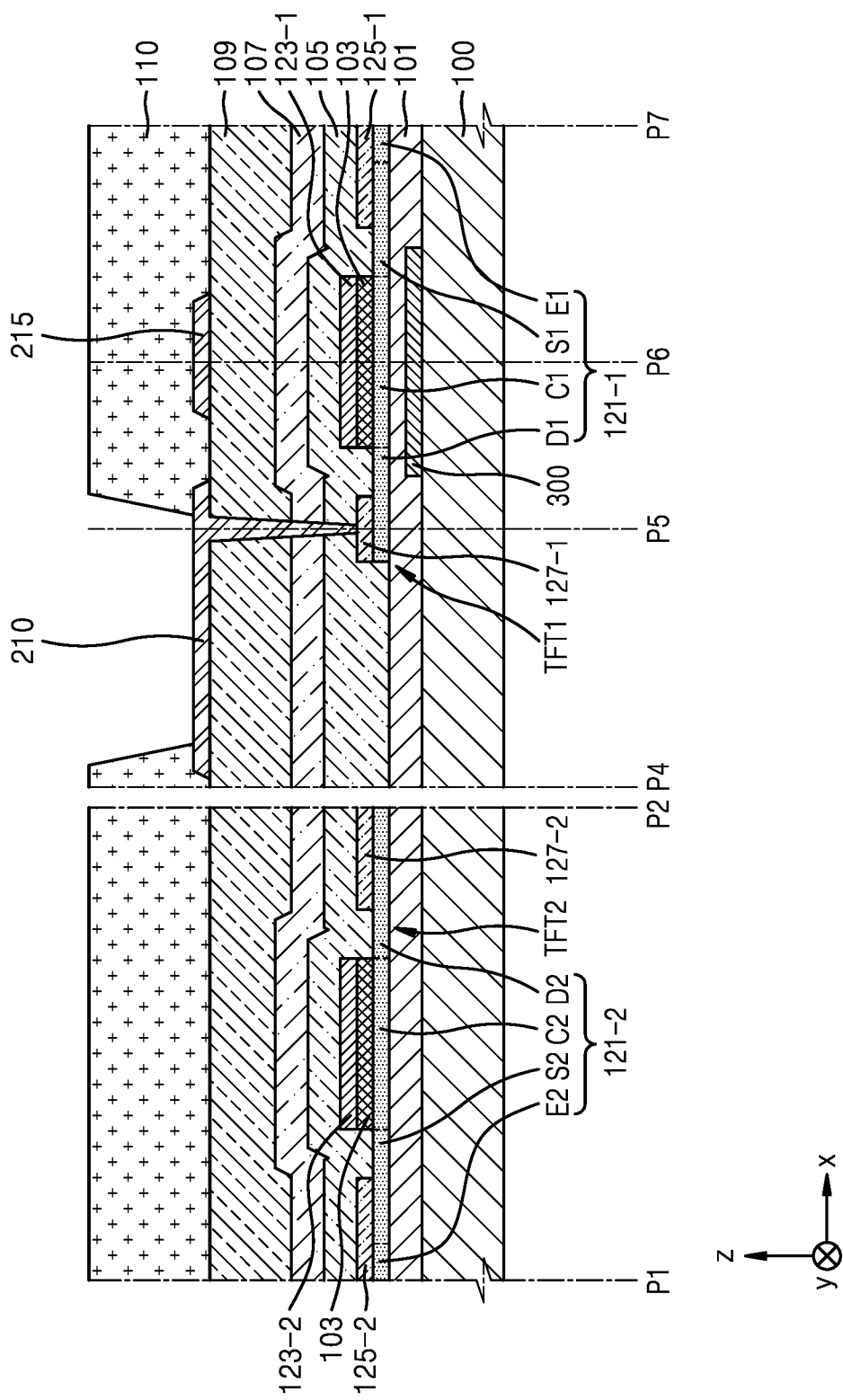
Figure 17:
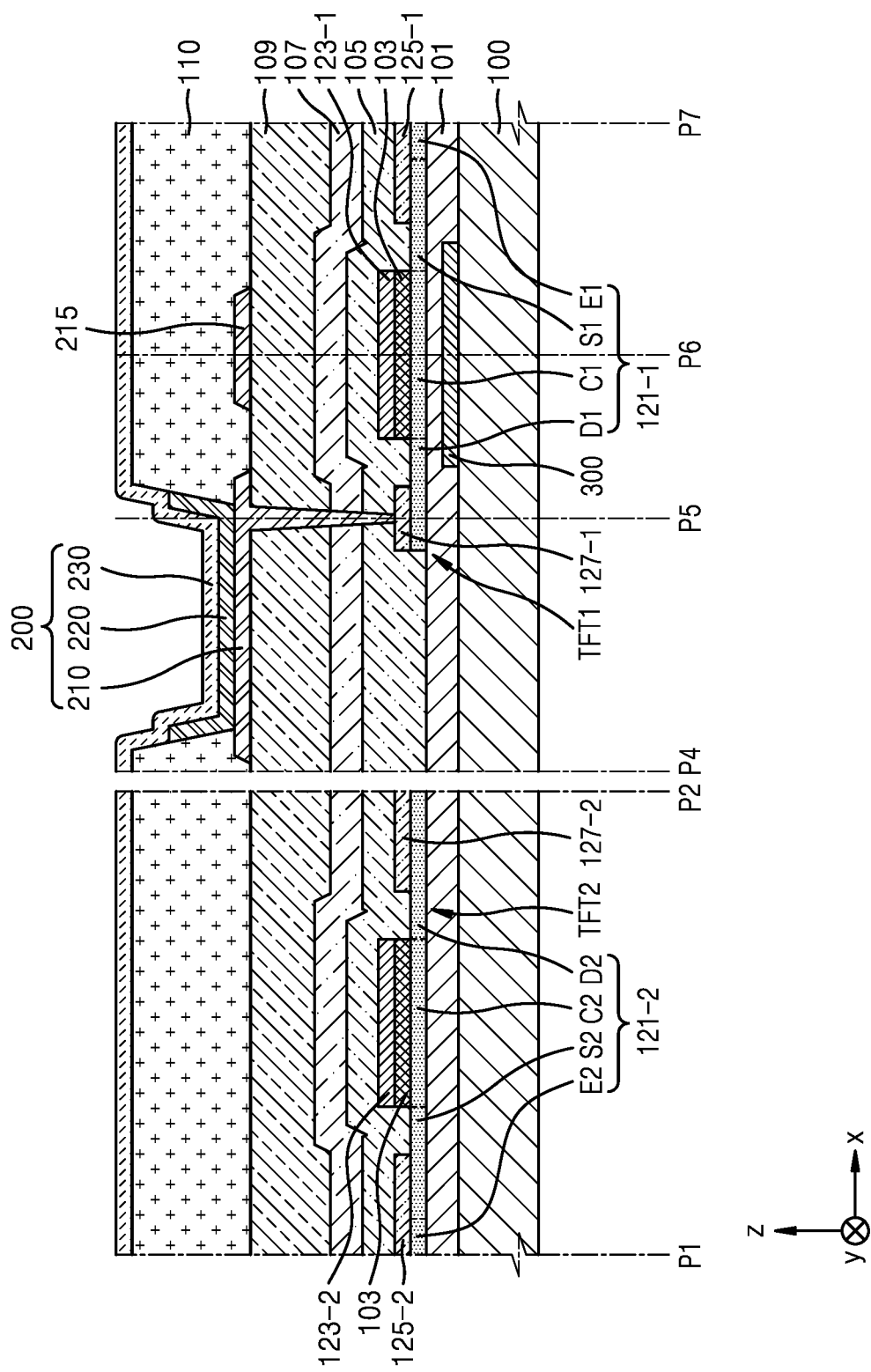

FIG. 16 is a process diagram illustrating the result of the sixth mask process S60.

The sixth mask process S60 may include forming a pixel-defining layer on the result of the fifth mask process S50, and patterning the pixel-defining layer into the pixel-defining layer 110 for defining an emission area and a non-emission area.

For example, in the sixth mask process S60, a photosensitive layer pattern may be formed on the result of the fifth mask process S50 in such a way that a photosensitive layer may be located only in a region where an opening of the pixel-defining layer 110 is to be formed by using a sixth mask, and a pixel-defining layer material may be arranged in a region that excludes a region where the photosensitive layer is located, so that the pixel-defining layer 110 having an opening for exposing a portion of the pixel electrode 210 may be formed.

As described above, according to some embodiments, a display device in which the efficiency of a process may be enhanced and a design space may be secured, and a method of manufacturing the same, may be implemented. The scope of the disclosure is not limited by the described aspects.

It should be understood that embodiments described herein should be considered in a descriptive sense only and not for purposes of limitation. Descriptions of features or aspects within the embodiments should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, with functional equivalents thereof to be included therein.

What is claimed is:

1. A display device comprising:
   a substrate comprising a first region in which a first pixel circuit is located, and a second region in which a second pixel circuit is located;
   a first active layer located on the first region, and comprising a first channel region, a first source region at a first side of the first channel region, a first drain region at a second side of the first channel region, and a first extension region extending in a direction from the first source region to the second region;
   a first gate electrode located above the first active layer, and overlapping the first channel region;
   a gate insulating layer between the first active layer and the first gate electrode in a region overlapping the first gate electrode;
   a driving voltage line located directly on the first active layer, overlapping the first source region, in a same layer as the gate insulating layer, and extending along the first extension region;
   a first connection electrode located on the first drain region; and
   a pixel electrode located above the first gate electrode and connected to the first connection electrode.

2. The display device of claim 1, further comprising:
   a second active layer located on the first region, and comprising a second channel region, a second source region at a first side of the second channel region, a second drain region at a second side of the second channel region, and a second extension region extending in a direction from the second source region to the first region;
   a second gate electrode located above the second active layer, and overlapping the second channel region;
   a data line located on the second active layer, overlapping the second source region, and extending along the second extension region;
   a second connection electrode located on the second drain region; and
   a bridge electrode electrically connecting the second connection electrode to the first gate electrode.

3. The display device of claim 2, further comprising:
   a third active layer located on the second region, and comprising a third channel region, a third source region at a first side of the third channel region, a third drain region at a second side of the third channel region, and a third extension region extending in a direction from the third source region to the first region, and being integral with the first extension region; and
   a third gate electrode located above the third active layer and overlapping the third channel region,
   wherein the driving voltage line extends from the first extension region to the third extension region and overlaps the third source region.

4. The display device of claim 3, further comprising:
   a fourth active layer located on the second region, and comprising a fourth channel region, a fourth source region at a first side of the fourth channel region, a fourth drain region at a second side of the fourth channel region, and a fourth extension region extending in a direction from the fourth source region to the first region, and being integral with the second extension region; and
   a fourth gate electrode located above the fourth active layer and overlapping the fourth channel region,
   wherein the data line extends from the second extension region to the fourth extension region and overlaps the fourth source region.

5. The display device of claim 2, wherein the gate insulating layer is between the second active layer and the second gate electrode in a region overlapping the second gate electrode.

6. The display device of claim 2, wherein the driving voltage line, the data line, the first connection electrode, and the second connection electrode comprise a same material, and have a same layered structure.

7. The display device of claim 2, wherein the first active layer and the second active layer comprise an oxide semiconductor.

8. The display device of claim 1, further comprising a bottom metal layer (BML) having an isolated shape, and located below the first active layer.

9. The display device of claim 8, wherein the BML is electrically connected to the pixel electrode through a contact hole.

10. The display device of claim 9, further comprising an opposite electrode located on the pixel electrode, and an intermediate layer between the pixel electrode and the opposite electrode and comprising an emission layer.

11. A display device comprising:
    a substrate comprising a first region in which a first pixel circuit is located, and a second region in which a second pixel circuit is located;
    a first active layer located on the first region, and comprising a first channel region, a first source region at a first side of the first channel region, a first drain region at a second side of the first channel region, and a first extension region extending in a direction from the first source region to the second region;

a first gate electrode located above the first active layer, and overlapping the first channel region;

a driving voltage line located on the first active layer, overlapping the first source region, and extending along the first extension region;

a first connection electrode located on the first drain region;

a pixel electrode located above the first gate electrode and connected to the first connection electrode;

a second active layer located on the first region, and comprising a second channel region, a second source region at a first side of the second channel region, a second drain region at a second side of the second channel region, and a second extension region extending in a direction from the second source region to the first region;

a second gate electrode located above the second active layer, and overlapping the second channel region;

a data line located on the second active layer, overlapping the second source region, and extending along the second extension region;

a second connection electrode located on the second drain region; and a bridge electrode electrically connecting the second connection electrode to the first gate electrode, and comprising a same material as the pixel electrode, and has a layered structure that is the same as a layered structure of the pixel electrode.

* * * * *